United States Patent
Watanabe

(10) Patent No.: US 6,937,824 B2
(45) Date of Patent: Aug. 30, 2005

(54) OPTICAL TRANSCEIVER, CONNECTOR, SUBSTRATE UNIT, OPTICAL TRANSMITTER, OPTICAL RECEIVER, AND SEMICONDUCTOR DEVICE

(75) Inventor: Toshiaki Watanabe, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 171 days.

(21) Appl. No.: 10/307,285

(22) Filed: Dec. 2, 2002

(65) Prior Publication Data

US 2003/0123818 A1 Jul. 3, 2003

(30) Foreign Application Priority Data

Dec. 28, 2001 (JP) .......................... 2001-399654
Mar. 25, 2002 (JP) .......................... 2002-084164

(51) Int. Cl.[7] .......................... G02B 6/36; G02B 6/42; H04B 10/02; H04B 10/12
(52) U.S. Cl. .......................... 398/135; 398/139; 385/92; 385/88
(58) Field of Search .......................... 385/88–94; 398/134, 398/135–139, 140, 141, 22–24, 128, 129

(56) References Cited

U.S. PATENT DOCUMENTS

2003/0180013 A1 * 9/2003 Rosenberg et al. ........... 385/92

FOREIGN PATENT DOCUMENTS

| JP | 56-85103 | 6/1980 |
| JP | 56-4901 | 1/1981 |
| JP | 59-172747 | 9/1984 |
| JP | 60-86852 | 5/1985 |
| JP | 62-193316 | 12/1987 |
| JP | 2-44280 | 3/1990 |
| JP | 2-61968 | 3/1990 |
| JP | 2-79602 | 6/1990 |
| JP | 2-238692 | 9/1990 |
| JP | 3-192757 | 8/1991 |
| JP | 5-121126 | 5/1993 |
| JP | 5-166876 | 7/1993 |
| JP | 5-183310 | 7/1993 |
| JP | 6-163124 | 6/1994 |
| JP | 6-163339 | 6/1994 |
| JP | 7-142668 | 6/1995 |
| JP | 8-37500 | 2/1996 |
| JP | 2000-100496 | 4/2000 |
| JP | 2000-114641 | 4/2000 |
| JP | 2001-168235 | 6/2001 |

* cited by examiner

Primary Examiner—Akm Enayet Ullah
Assistant Examiner—Kevin S. Wood
(74) Attorney, Agent, or Firm—Burns, Doane, Swecker & Mathis LLP

(57) ABSTRACT

One ends of a plurality of interface pins are attached to a substrate in a line. Optical semiconductor device and an electric circuit are mounted on this substrate. The other ends of the interface pins are fit into holes in an another substrate. Signals are exchanged between the two substrates via the interface pins. The interface pins are embedded in a dielectric material. A plurality of ground pins and/or ground through holes may be provided in the dielectric material around the interface pins. The dielectric constant of the dielectric material is less than the dielectric constants of the two substrates.

4 Claims, 23 Drawing Sheets

US 6,937,824 B2

OPTICAL TRANSCEIVER, CONNECTOR, SUBSTRATE UNIT, OPTICAL TRANSMITTER, OPTICAL RECEIVER, AND SEMICONDUCTOR DEVICE

BACKGROUND OF THE INVENTION

1) Field of the Invention

The present invention relates to an optical transceiver, a connector, a substrate unit, an optical transmitter, an optical receiver, and a semiconductor device, that perform signal transmission via interface pins.

2) Description of the Related Art

The optical transceiver performs transmission and reception as follows. That is, when transmitting, the optical transceiver converts the data signal, which is an electric signal, into an optical signal, and transmits the optical signal via an optical fiber for transmission. On the other hand, when receiving, the optical transceiver receives an optical signal via an optical fiber for reception, and converts the optical signal into the data signal, which is an electric signal.

The optical transceiver is sometimes fitted to a substrate of a host system device (also referred to as an optical transmission device), which is externally equipped. The host system device generates digital data signals, distributes and transmits the generated digital data signals to a plurality of optical transmitters and receivers, and carries out various processing with respect to the data signal transmitted from the transmitters and receivers.

When fitting the optical transceiver to the substrate of the host system device, an electrical interface is obtained by connecting the optical transceiver to a system substrate of the host system device, using a plurality of interface pins protruding downwards from the bottom of a housing. In other words, no connector is not used when fitting the optical transceiver to the substrate. The interface pins are used for transferring power supply, clock and signals, such as power-supply voltage, control signals, high-speed pulse signals, and high-speed clock signals.

In the optical communication system that transmits optical signals via the optical fiber, the transmission rate of the optical signal has recently been increased rapidly, in order to respond to an increase in the communication traffic accompanying popularization of the Internet. In the optical transmitter/receiver, the transmission rate is now shifting from 2.5 Gb/s to 10 Gb/s, and research and development is now under way to realize the transmission rate of 40 Gb/s. Accompanying this, the optical transceiver is also required to have the capability to handle signal with high transmission rate.

FIGS. 27A and 27B show a schematic configuration of a conventional optical transceiver and an interface structure between the system substrate and the optical transceiver. FIG. 27A is a top view with an upper lid being removed, and FIG. 27B is a sectional side view taken along the line A—A shown in FIG. 27A. FIGS. 27A and 27B show an example of an optical transceiver 117 that performs signal transmission at a data rate of 2.5 Gb/s.

A housing 101 of the optical transceiver 117 has a rectangular shape and it is formed by bending a metal plate on four sides. The metal plate has a thickness of from about 0.5 to 1 mm. The housing 101 has four sidewalls 101b, a bottom 101a, and an upper lid 116. Long holes 101c for interface are provided near two sides on the bottom 101a. At least three protrusions 101d are provided (see FIG. 27B) on the outer surface of the bottom 101a. These protrusions 101d abut on the system substrate 114, so that the housing 101 is stably seated on the system substrate 114.

A substrate 109 is provided in the housing 101. A laser diode driver 102, a laser diode module 103 having a laser diode (LD) provided therein, a photo diode module 104 having a photo diode (PD) provided therein, a receiving circuit 105 including a PLL (phase-locked loop) circuit and a data identification and generation circuit, and a control circuit 108 including a power supply circuit and various control devices are mounted on the substrate 109. An optical fiber 106 for transmission is connected to the laser diode module 103, and an optical fiber 107 for reception is connected to the photo diode module 104. Substrate holding members 115 provided on the bottom 101a support the substrate 109.

Substrate lines 110a (transmission side), 110b (transmission side), 110c (reception side), 110d (reception side), 111a and 111b are formed on the substrate 109. The substrate lines 111a connect low speed interface pins to the control circuit 108. The substrate lines 111b connect the laser diode driver 102, the laser diode module 103, the photo diode module 104, and the receiving circuit 105 to the control circuit 108, respectively. The substrate lines 110a (transmission side), 110b (transmission side), 110c (reception side) and 110d (reception side) have such a structure that they can transmit data signals and clock signals, which may even be high frequency signals. Further, about four to ten high speed interface pins (white circles) 112a (transmission side), 112c (reception side), which can transmit data signals and clock signals, which may even be high frequency signals, are provided. Moreover, the low speed interface pins 112b, to which low frequency control signals and dc voltage are supplied, and ground pins (black circles) 113 for grounding are connected and fixed to the substrate 109. The substrate 109 is electrically connected to the system substrate 114, via the interface pins 112a to 112c (collectively referred to as interface pins 112) and the ground pins 113. Thereby, an exchange of signals can be performed between the optical transceiver 117 and the host system device.

The interface pins 112 and the ground pins 113 are linearly arranged in a row, at each edge on the long side of the substrate 109, and protrude downwards from the long holes 101c formed in the housing 101. The respective pins 112 and 113 are inserted into pin holes provided in the system substrate 114, and soldered. Thus, an electric connection between the substrate 109 and the system substrate 114 can be realized without the use of a connector.

The substrate holding member 115 is arranged at four corners on the bottom 101a of the housing 101. Each of the substrate holding members 115 is joined with the substrate 109 at one end, and fixed on the bottom 101a of the housing 101 at the other end. Therefore, there is a gap of several millimeters between the substrate 109 and the bottom 101a of the housing 101. These substrate holding members 115 are provided so that the pattern wiring on the back of the substrate 109 does not come in contact with the bottom 101a of the metal housing 101.

The conventional optical transceiver operates as described below. A data signal (pulse signal) of 2.5 Gb/s and a clock signal of 2.5 GHz are input from the system substrate 114 through the interface pins 112a, and these signals are transmitted to the laser diode driver 102 via the substrate lines 110b. Further, power supply voltage and control signals are supplied to the control circuit 108 through the interface pins 112b and the substrate lines 111a.

The laser diode driver 102 generates a modulation signal (pulse signal) Im for driving the laser diode module 103, based on the data signal of 2.5 Gb/s and the clock signal of 2.5 GHz. The modulation signal Im generated in the laser diode driver 102 is transmitted to the laser diode module 103 via the substrate line 110a. The control circuit 108 supplies dc voltage to the laser diode driver 102, the laser diode module 103, the photo diode module 104 and the receiving circuit 105 via the substrate lines 111b, and monitors the respective equipment. As a result, the laser diode in the laser diode module 103 emits light, and an optical signal is emitted, with the intensity thereof modulated. The emitted optical signal enters into the end face of the optical fiber 106, and hence an optical signal Po is propagated in the optical fiber 106.

The photo diode module 104 receives an optical signal Pi via the optical fiber 107, and photoelectrically exchanges the optical signal to a current signal by the built-in photo diode, then converts the current signal to a voltage signal by a built-in preamplifier, and transmits the converted voltage signal to the receiving circuit 105 via the substrate line 110c. The receiving circuit 105 extracts a clock based on the voltage signal transmitted from the photo diode module 104, and regenerates the data signal. The data signal and the clock signal regenerated by the receiving circuit 105 are input from the substrate line 110d to one end of the interface pin 112c, and are impedance-converted. The signal input to the one end of the interface pin 112c is input to the system substrate 114 connected to the other end thereof through the interface pin 112c.

As a result of an increase in the transmission rate of the optical signal, problems that are described below arise in the conventional optical transceiver.

For example, when a data signal of 10 Gb/s higher in rate than 2.5 Gb/s and a clock signal of 10 GHz higher in rate than 2.5 GHz are to be transferred between the optical transceiver and the system substrate 114, the transmission characteristic deteriorates, causing a problem in that high speed signals cannot be transmitted, unless the characteristic impedance (normally 50Ω) of the substrate lines 110b is matched with that of the interface pins 112a, or the characteristic impedance (normally 50Ω) of substrate lines 110d is matched with that of the interface pins 112c.

In the conventional optical transceiver, there is a gap 118 of about 2 to 5 mm between the substrate 109 and the system substrate 114, depending on the height of the substrate holding member 115, the thickness of the bottom plate 101a of the housing 101, and the height of the protrusion 101d provided in the housing 101.

Due to the existence of this gap 118, an air layer exists between the substrate 109 and the system substrate 114, and it is actually difficult to match the characteristic impedance of the interface pins with the characteristic impedance (normally 50Ω) of the substrate lines 110b and 110d.

Therefore, in the conventional optical transceiver, there is a problem in that when a high speed data signal of about 10 Gb/s or higher and a high speed clock signal of about 10 GHz of higher are to be transmitted, the transmission characteristic deteriorates. The deterioration in the transmission characteristic is allowable in putting the optical transceiver to practical use, for a data signal having a bit rate of about 2.5 Gb/s, but if the bit rate becomes about 10 Gb/s, deterioration in the transmission characteristic becomes noticeable, and cannot be ignored.

If an interface connector (coaxial connector) with the characteristic impedance being controlled, or a connection line using a waveguide is used instead of the interface pin, impedance characteristic that is electrically preferable can be obtained, but the quantity of connection lines required for transmission of the data signal and the clock signal is about four to ten. Use of such connection lines increases the size of the interface apparatus and increases the cost, and hence it is not practical for the optical transceiver that is required to be cheap and installed in a large quantity.

Thus, there is a problem in the conventional optical transceiver, that when a data signal of about 10 Gb/s and a clock signal of about 10 GHz are transmitted using interface pins, it is difficult to match the characteristic impedance of the substrate line with that of the interface pins.

SUMMARY OF THE INVENTION

It is an object of this invention to provide an optical transceiver, a connector, a substrate unit, an optical transmitter, an optical receiver, and a semiconductor device, that can match the characteristic impedance of the substrate line with that of the interface pins with a simple and cheap configuration, and that can transmit data signals and clock signals at high speed.

According to the present invention, one ends of a plurality of interface pins are attached to a substrate in a line. Optical semiconductor device and an electric circuit are mounted on this substrate. The other ends of the interface pins are fit into holes in an another substrate. Signals are exchanged between the two substrates via the interface pins. The interface pins are embedded in a dielectric material. A plurality of ground pins and/or ground through holes may be provided in the dielectric material around the interface pins. The dielectric constant of the dielectric material is less than the dielectric constants of the two substrates.

These and other objects, features and advantages of the present invention are specifically set forth in or will become apparent from the following detailed descriptions of the invention when read in conjunction with the accompanying drawings.

BRIEF DESCRIPTION OF THE DRAWINGS

FIG. 1A is a plan view and FIG. 1B is a sectional view taken along the line B—B shown in FIG. 1A, FIGS. 2A and 2B are diagrams that show arrangement of pins in the optical transceiver module according to the first embodiment, FIG. 5A is a plan view and FIG. 5B is a sectional view along the line C—C shown in FIG. 5A, FIG. 7A is a plan view and FIG. 7B is a sectional view taken along the line D—D shown in FIG. 7A, FIG. 10A is an elevational view and FIG. 10B is a bottom view, FIG. 11A is a plan view, FIG. 11B is a longitudinal sectional view taken along the line E—E shown in FIG. 11A, and FIG. 11C is a cross sectional view taken along the line F—F shown in FIG. 11A, FIG. 27A is a plan view and FIG. 27B is a sectional view taken along the line A—A shown in FIG. 27A.

DETAILED DESCRIPTION

Figure 1A:
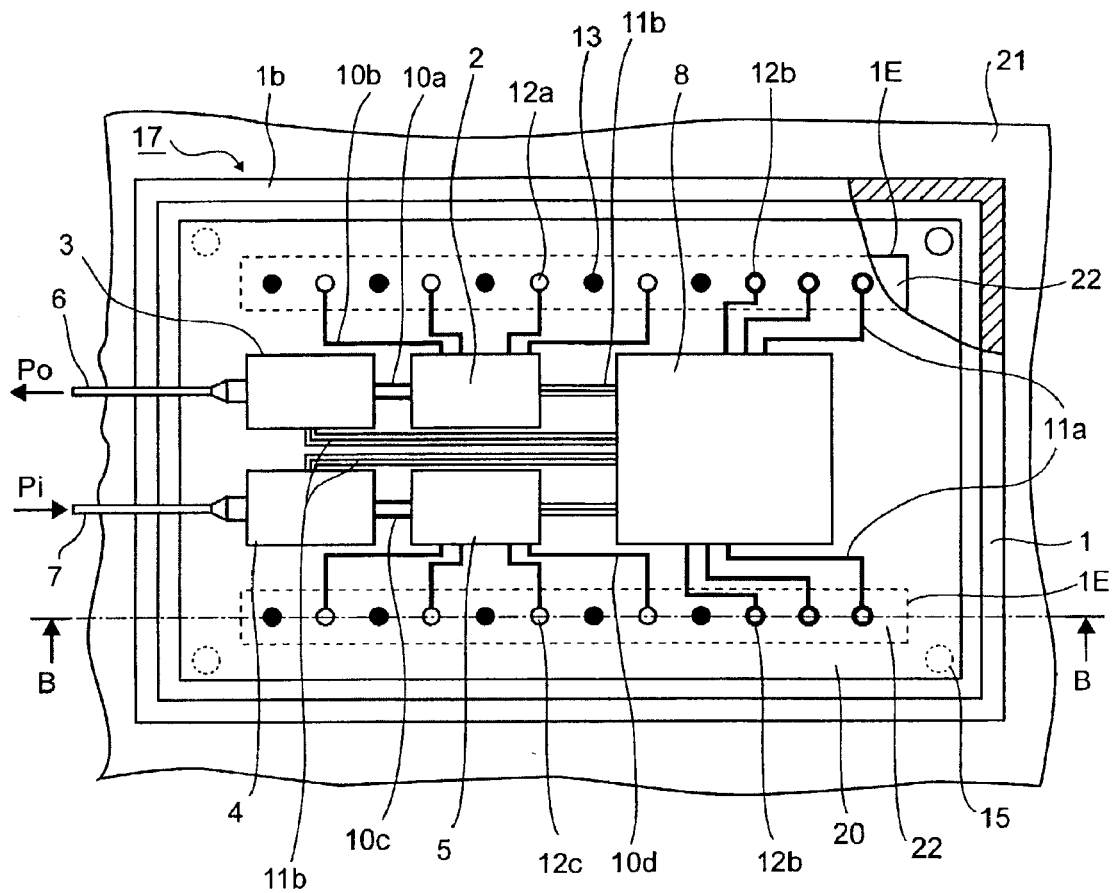
FIGS. 1A and 1B are diagrams that show an optical transceiver module according to a first embodiment of the invention.

The optical transceiver, the connector, the substrate unit, the optical transmitter, the optical receiver, and the semiconductor device according to the present invention will be explained in detail, with reference to the accompanying drawings.

In a first embodiment of this invention, a dielectric block 22 is arranged in a gap 23 between a substrate 20 provided in an optical transceiver and a system substrate 21 of a host system device. Data transmission at 10 Gb/s and clock transmission at 10 GHz are realized, with the interface pins 12a and 12c interposed between the substrate 20 and the substrate 21, using an interface structure that matches the characteristic impedance of interface pins 12a and 12c with the characteristic impedance of substrate lines 10a and 10b.

Figure 1B:
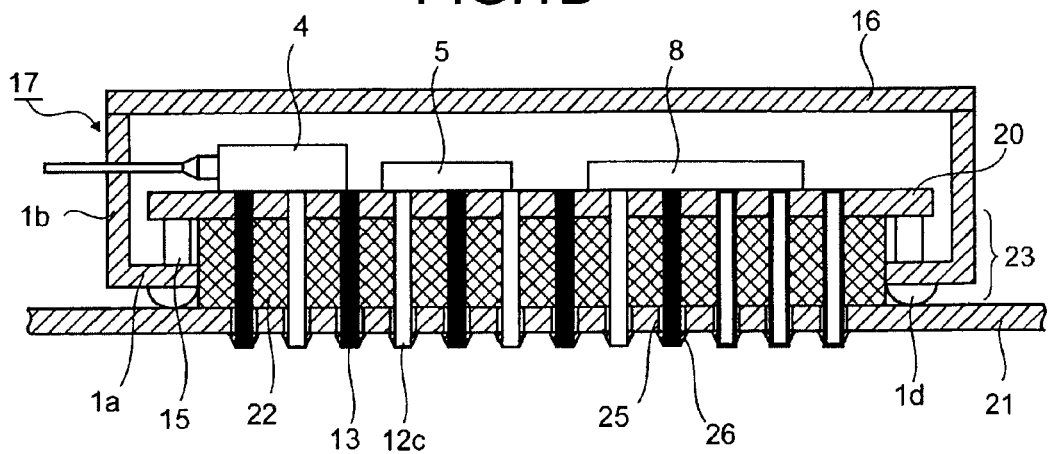
Figure 2A:
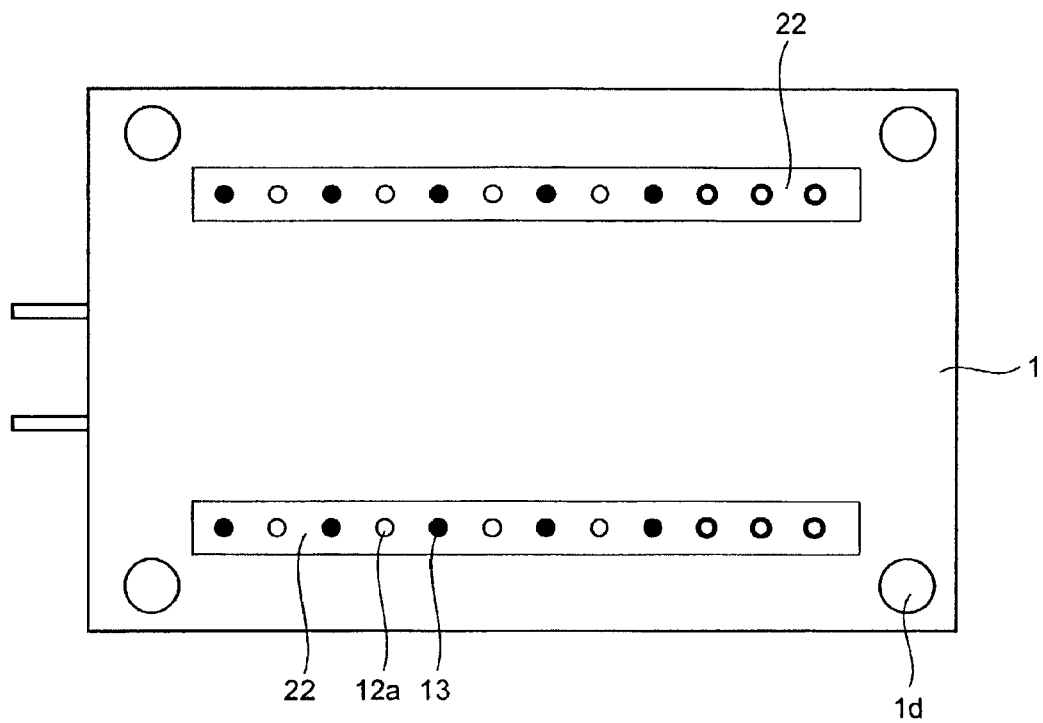
FIG. 2A is a plan view and FIG. 2B is a sectional view taken along the line B—B shown in FIG. 1A.
Figure 2B:
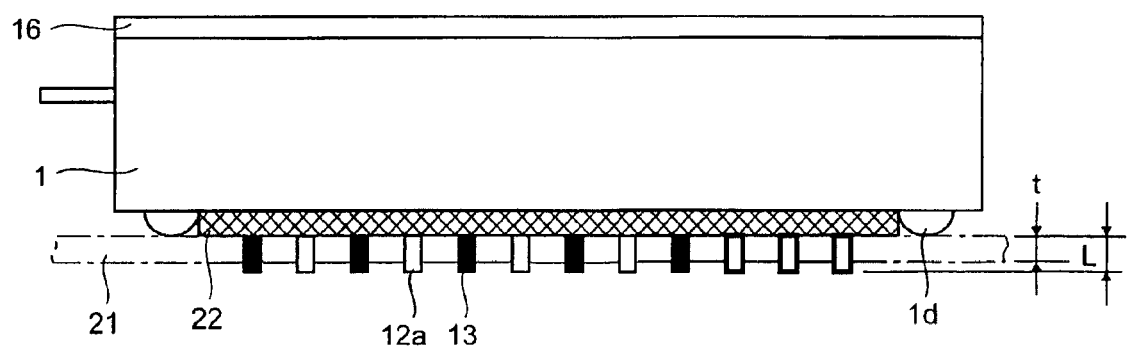
Figure 3:
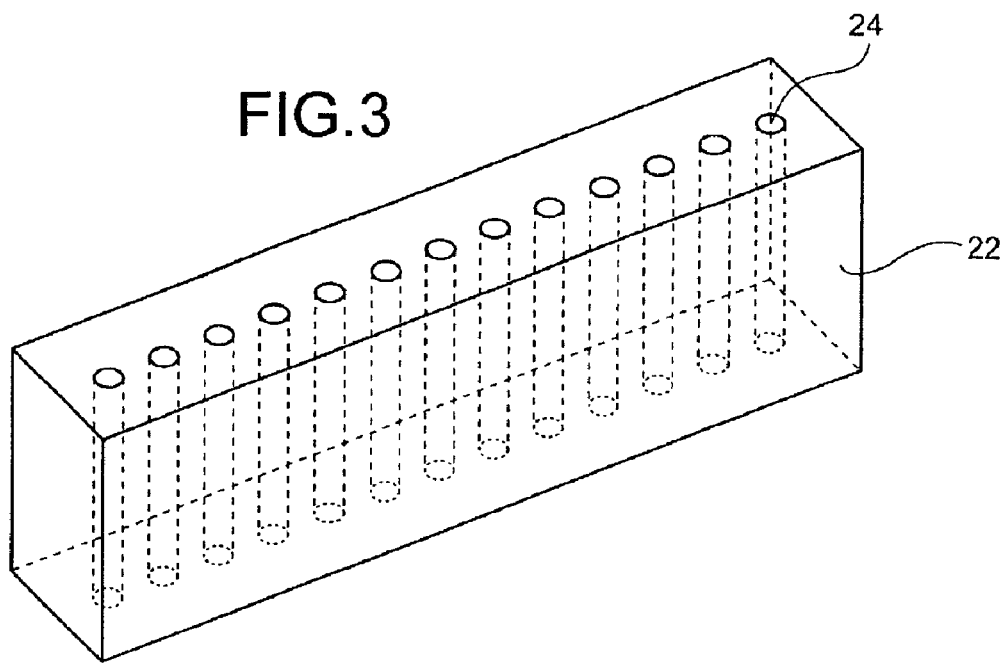
FIG. 3 is a perspective view that shows a dielectric block used in the optical transceiver module according to the first embodiment.

FIGS. 1A and 1B are diagrams that show how the optical transceiver 17 according to the first embodiment and the system substrate 21 are connected to each other. Precisely, FIG. 1A is a top view with an upper lid removed, and FIG. 1B is a sectional side view taken along the line B—B shown in FIG. 1A. FIGS. 2A and 2B are diagrams that show the optical transceiver, according to the first embodiment, before it is connected to the system substrate. Precisely, FIG. 2A is a bottom view and FIG. 2B is a side view. FIG. 3 is a perspective view of a dielectric block.

A housing 1 of the optical transceiver 17 has a rectangular shape and it is formed by bending a metal plate on four sides. The metal plate has a thickness of from about 0.5 to 1 mm. The housing 1 has four sidewalls 1b, a bottom 1a, and an upper lid 16. Protrusions 1d are provided at three or more places (in this case, four places) on the outer surface of the bottom 1a. Since the protrusions 1d abut on the system substrate 21, the housing 1 is stably seated on the system substrate 21. The protrusions 1d may be made of elastic material such as rubber or may be made of metallic material having a spring property. A rectangular hole 1E is formed in the bottom 1a. A dielectric block 22, which is described later, is inserted in this hole 1A and protrudes out of the housing 1 (see FIGS. 1B and 2B).

A substrate 20 is provided in the housing 1. A laser diode driver 2, a laser diode module 3 having a laser diode provided therein, a photo diode module 4 having a photo diode provided therein, a receiving circuit 5 including a PLL circuit and a data identification and generation circuit, and a control circuit 8 including a power supply circuit and various control devices are mounted on the substrate 20. An optical fiber 6 for transmission is connected to the laser diode module 3, and an optical fiber 7 for reception is connected to the photo diode module 4. Substrate holding members 15 provided on the bottom 1a support the substrate 21. The substrate holding members 15 are arranged at four corners on the inner surface of the bottom 1a.

Substrate lines 10a (transmission side), 10b (transmission side), 10c (reception side), 10d (reception side), 11a and 11b are formed on the substrate 20. The substrate lines 11a are for connecting low speed interface pins 12b to the control circuit 8, and the substrate lines 11b are for connecting the laser diode driver 2, the laser diode module 3, the photo diode module 4, and the receiving circuit 5 to the control circuit 8, respectively. The substrate lines 10a (transmission side), 10b (transmission side), 10c (reception side) and 10d (reception side) have such a structure that they can transmit data signals and clock signals, including high frequency signals, and are formed of for example a differential transmission line.

Further, about four to ten high speed interface pins (white circles) 12a (transmission side), 12c (reception side), which can transmit data signals and clock signals, including high frequency signals, low speed interface pins 12b, to which low frequency control signals and dc voltage are supplied, and ground pins (black circles) 13 for grounding are connected and fixed to the substrate 20. The substrate 20 is electrically connected to the system substrate 21, via these interface pins 12a to 12c (collectively referred to as interface pins 12) and the ground pins 13. Thereby, an exchange of signals can be performed between the optical transceiver 17 and the host system device.

The interface pins 12a are connected to the laser diode driver 2 via the substrate lines 10b, and the interface pins 12c are connected to the receiving circuit 5 via the substrate lines 10d. The interface pins 12b are connected to the control circuit 8 via the substrate lines 11a. These interface pins 12a, 12b and 12c are formed in the same shape, and the quantity thereof is about several tens in total.

The interface pins 12 and the ground pins 13 are linearly arranged in a row, at each edge on the long side of the substrate 20, and perpendicularly protrude downwards from the substrate 20. In order to insert the interface pins 12 and the ground pins 13 in two rows to cover the circumferences of these pins 12 and 13, a pair of dielectric blocks 22, having a rectangular shape and flat upper and lower faces, are fixed on the back of the substrate 20. As shown in FIG. 3, the dielectric blocks 22 are provided with a plurality of holes 24 for inserting the interface pins 12 and the ground pins 13, and the interface pins 12 and the ground pins 13 are inserted into these holes 24. The upper face of the dielectric block 22 is joined to the rear face of the substrate 20, with the interface pins 12 and the ground pins 13 being inserted in the holes 24. The respective interface pins 12 and ground pins 13 slightly protrude perpendicularly from the lower face of the dielectric block 22, with the dielectric block 22 abutting on the lower face of the substrate 20. The protruding length L is longer than the plate thickness t of the system substrate 21 (see FIG. 2B).

When the interface pins 12 are inserted into the holes 25 for inserting the interface pins 12 provided in the system substrate 21, the lower face of the dielectric block 22 abuts on the upper side of the system substrate 21. In other words, the height dimension of the dielectric block 22 corresponds to a gap 23 between the lower face of the substrate 20 and the upper face of the system substrate 21. A conductor is respectively metalized on the internal circumference of the holes 25 in the system substrate 21, and this conductor is connected to the substrate line formed in the system substrate 21. The interface pins 12 are joined with the holes 25 in the system substrate 21 by a solder 26, with the interface pins 12 being inserted in the system substrate 21. The solder 26 is arranged on the lower side of the system substrate 21, to join the circumferences of the tips of the interface pins 12 with the system substrate 21. As a result, the optical transceiver 17 can be fixed on the system substrate 21.

The optical transceiver 17 in the first embodiment transmits 10-Gb/s data signals and 10-GHz clock signals via the interface pins 12, in the following manner.

Operation as a Transmitter

When the transmitter is operated, the 10-Gb/s data signal and the 10-GHz clock signal transmitted from the system substrate 21 are input to the interface pins 12a. These signals are transmitted from the interface pins 12a to the substrate lines 10b.

The dielectric blocks 22 of the same material as that of the substrate 20 or those having the similar dielectric constant to that of the substrate 20 (for example, a resin material having a dielectric constant $\epsilon$ of 4.3 (for example, BT resin)) are arranged between the substrate 20 of the optical transceiver 17 and the system substrate 21. Thereby, the characteristic impedance of the interface pins 12a substantially matches with the characteristic impedance of the substrate lines 10b, and the 10-Gb/s data signal and the 10-GHz clock signal are transmitted to the substrate lines 10b, with deterioration in the transmission characteristic being suppressed. The transmitted signals are input to the laser diode driver 2.

The laser diode driver 2 generates a modulation signal Im (pulse signal) of 10 Gb/s, adjusted to a predetermined amplitude for driving the laser diode module 3, based on the input 10-Gb/s data signal and the 10-GHz clock signal. The modulation signal Im generated by the laser diode driver 2 is transmitted to the laser diode module 3 via the substrate line 10a. The control circuit 8 supplies dc voltage to the laser diode driver 2, the laser diode module 3, the photo diode module 4 and the receiving circuit 5 via the substrate lines 11b, and monitors the respective equipment. The laser diode module 3 superimposes the modulation signal Im on the dc voltage Ib (bias signal) supplied from the control circuit 8, and drives the laser diode provided therein based on the superimposed signal. Thereby, the laser diode in the laser diode module 3 emits light, and an optical signal is emitted with the intensity thereof modulated. The emitted optical signal enters into the end face of the optical fiber 6, and the optical signal Po is propagated within the optical fiber 6.

Operation as a Receiver

An example in which the optical transceiver 17 outputs the 10-Gb/s data signal and the 10-GHz clock signal to the system substrate 21 will be explained below.

In this case, an optical signal Pi input from the optical fiber 7 to the photo diode module 4 is converted to a current signal by a photo diode built in the photo diode module 4, and converted to a voltage signal by a preamplifier built therein and output. This output voltage signal is input to the receiving circuit 5 via the substrate line 10c. The receiving circuit 5 adjusts the amplitude of the voltage signal transmitted from the photo diode module 4, extracts a clock from the voltage signal transmitted from the photo diode module 4 by the operation of the PLL circuit provided therein, identifies the data signal by an identification and regeneration circuit provided therein, and regenerates the 10-Gb/s data signal and the 10-GHz clock signal. The regenerated data signal and clock signal are output to the substrate lines 10d. The substrate lines 10d output these signals to the interface pins 12c.

The dielectric blocks 22 of the same material as that of the substrate 20 or those having the similar dielectric constant to that of the system substrate 21 are filled in the gap 23 between the substrate 20 and the system substrate 21. Thereby, the characteristic impedance of the substrate lines 10b substantially matches with the characteristic impedance of the interface pins 12c, and the 10-Gb/s data signal and the 10-GHz clock signal are transmitted to the system substrate 21, with deterioration in the transmission characteristic being suppressed.

In order to explain the difference between the interface structure according to the first embodiment and the conventional interface structure, deterioration in the impedance characteristic due to the conventional interface structure shown in FIGS. 27A and 27B will be explained.

Figure 27A:
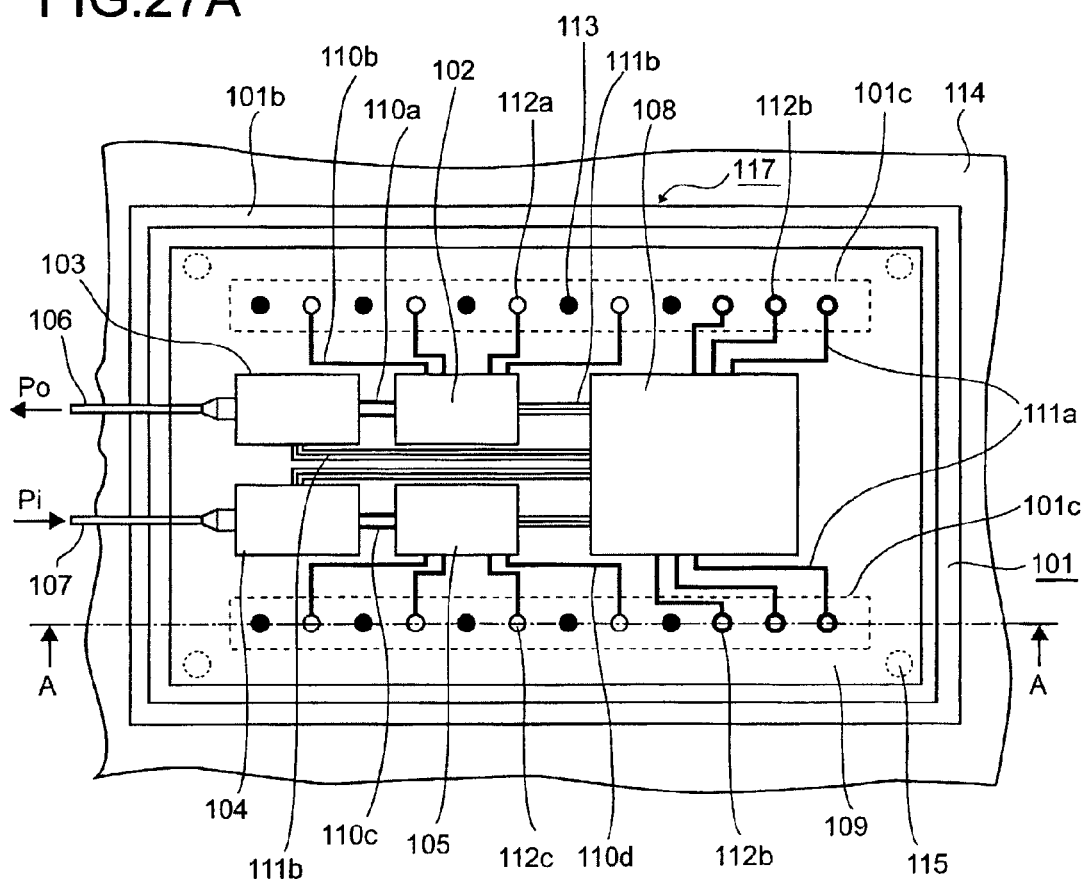
FIGS. 27A and 27B are diagrams that show the conventional art.
Figure 27B:
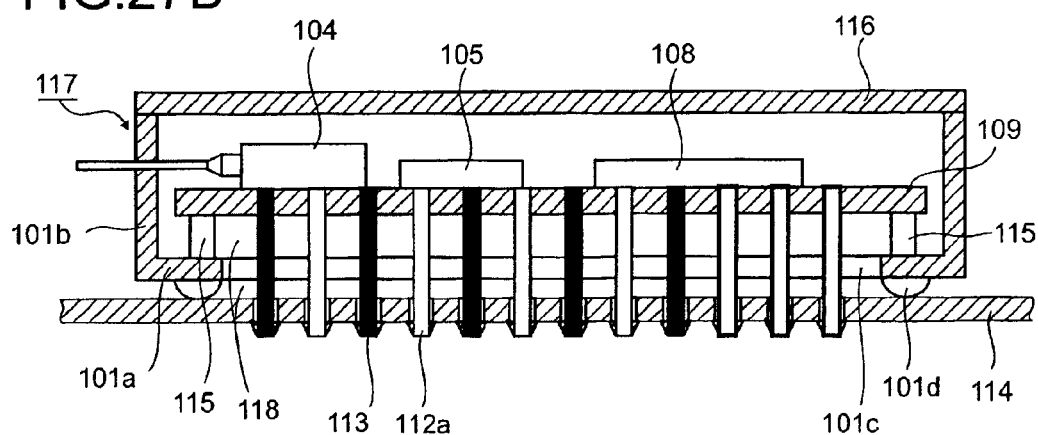

In the conventional interface structure shown in FIGS. 27A and 27B, there exists a gap between the interface pins 112 and the substrate 114. This gap is filled with the air. Thus, there is a cover of air, which has a dielectric constant of 1, around the interface pins 112. Therefore, for example, when a pitch D between the interface pin 112a (or 112c) and the ground pin 113 is 2.54 mm, and the diameter d of each pin is 1.27 mm, the characteristic impedance Z becomes about 104Ω according to the equation (1) described below. Hence, the characteristic impedance Z of the interface pin 112a (or 112c) in this case does not agree with the characteristic impedance (50Ω) of the substrate lines 110b and 110d.

As a result, the transmission characteristic of the 10-Gb/s data signal and the 10-GHz clock signal deteriorates, and transmission cannot be carried out.

$$Z = \frac{207}{\sqrt{\in}} \cdot \log\left(1.59 \cdot \frac{D}{d}\right) \quad (1)$$

wherein $\in$ is a dielectric constant.

On the other hand, in the interface structure according to the first embodiment shown in FIGS. 1A and 1B, the dielectric blocks 22 of the same material as that of the substrate 20 of the optical transceiver 17 or those having the similar dielectric constant to that of the substrate 20 (for example, a resin material having $\in$ of 4.3 (for example, BT resin)) are filled in the gap 23 between the substrate 20 of the optical transceiver 17 and the system substrate 21. For example, the dielectric block 22 is made of a resin material having $\in$ of 4.3 like the resin. Therefore, according to the equation (1), the characteristic impedance Z becomes 50Ω, thereby enabling suppression of deterioration in the transmission characteristic.

Figure 4:
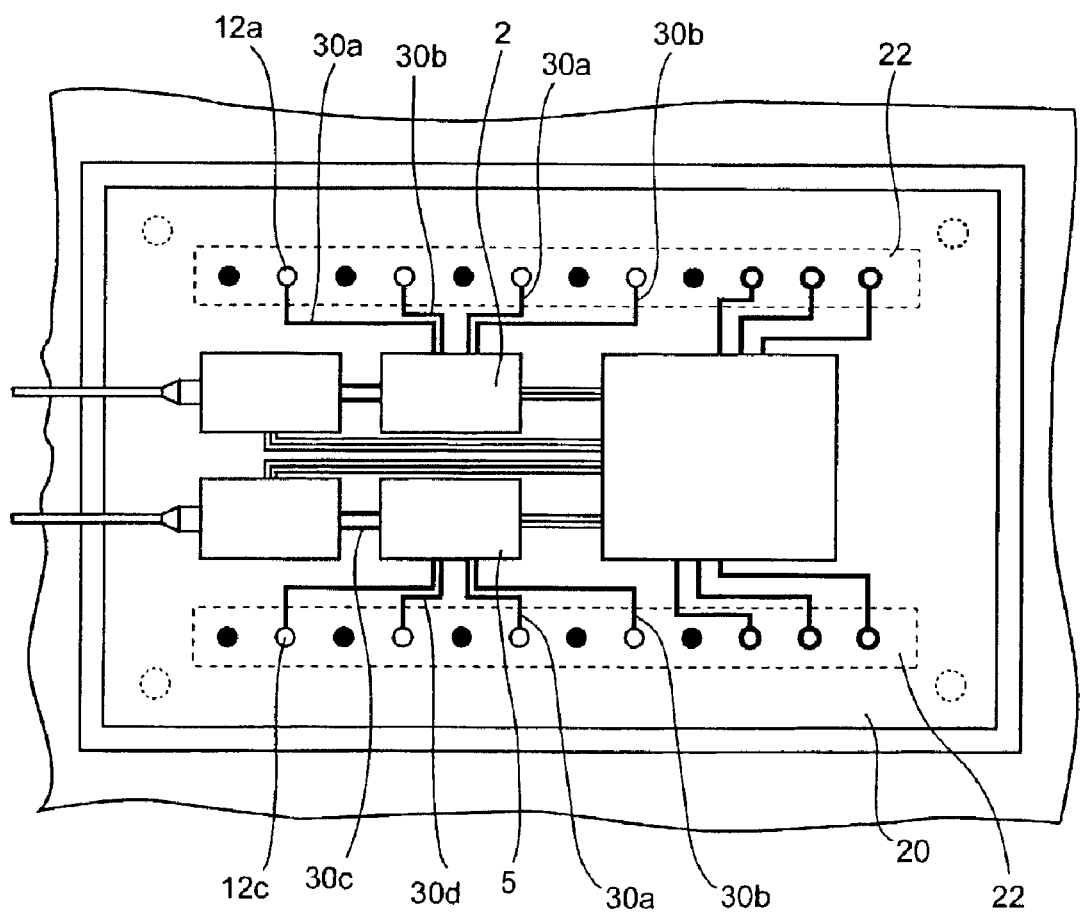
FIG. 4 is a plan view that shows a modification of the optical transceiver according to the first embodiment.

FIG. 4 is a plan view that shows a modification of the first embodiment shown in FIG. 1A. In this modification, the substrate lines 30a and 30b for connecting the high speed interface pins 12a and the laser diode driver 2, and the substrate lines 30c and 30d for connecting the high speed interface pins 12c and the receiving circuit 5 are differential lines, in which signals in positive phase and negative phase are respectively transmitted.

Therefore, the signal transmitted on the substrate 20 becomes strong against noise, and as a result, influence of noise can be suppressed in the signal processing in the laser diode driver 2, or in the signal processing in the system substrate 21, by the signal transmission between the interface pins 12a and the laser diode driver 2, or by the signal transmission between the interface pins 12c and the receiving circuit 5. The respective substrate lines are shown as if these are arranged on the surface of the substrate for convenience' sake of explanation, but these are not limited to this arrangement or the wiring pattern form, and for example, these may be provided in the inner layer of a multi-layer substrate.

Figure 5A:
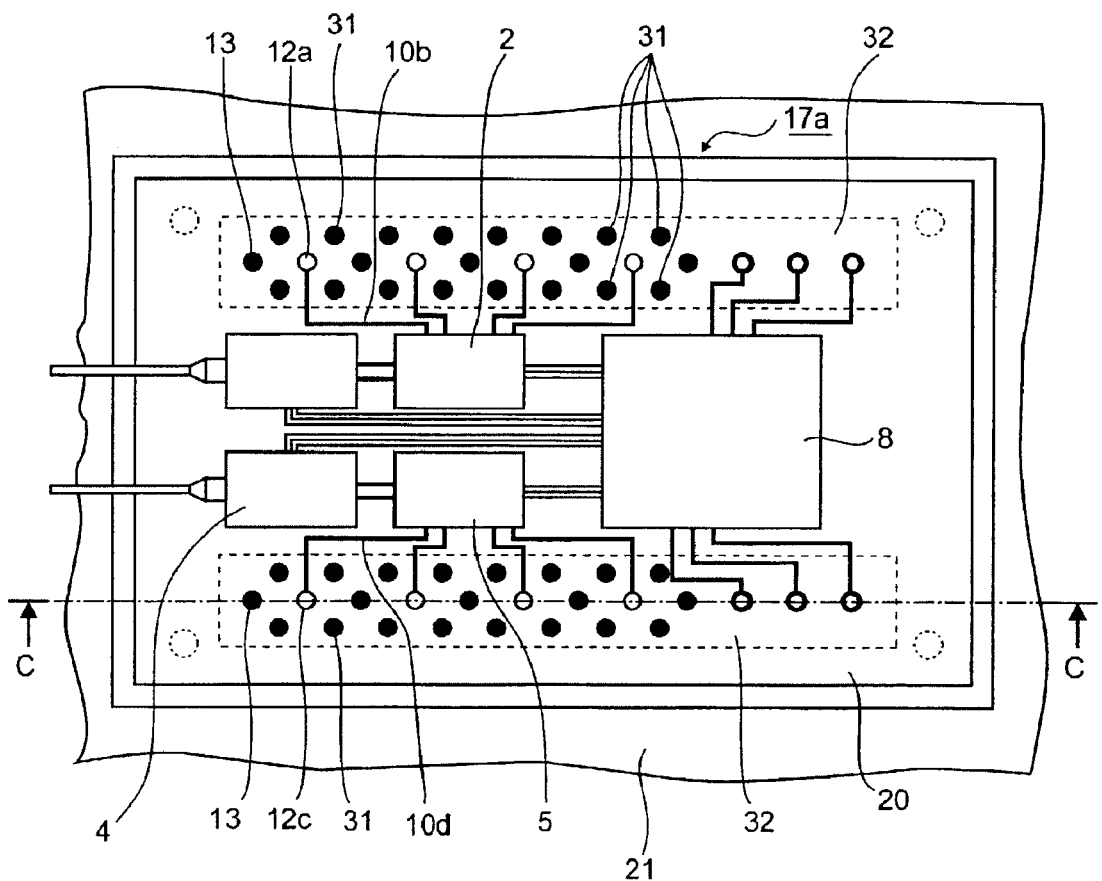
FIGS. 5A and 5B are diagrams that show an optical transceiver according to a second embodiment of the invention.
Figure 5B:
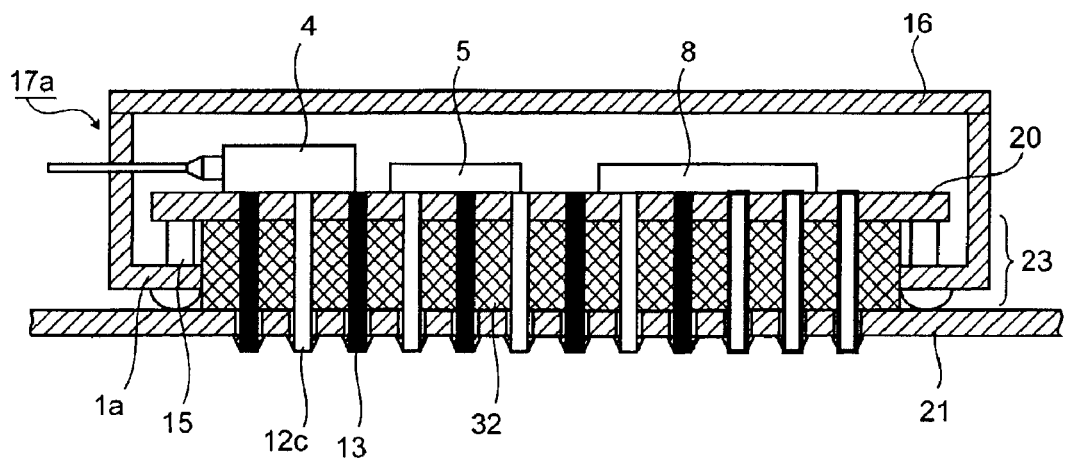

A second embodiment of the invention will be explained, with reference to FIGS. 5A and 5B and FIG. 6. FIGS. 5A and 5B are diagrams that show how the optical transceiver 17a in the second embodiment and the system substrate are connected to each other. Precisely, FIG. 5A is a top view with the lid 16 removed and FIG. 5B is a sectional view taken along the line C—C shown in FIG. 5. In FIGS. 5A and 5B, the explanation for the component, which achieves the same function as that in the first embodiment shown in FIGS. 1A and 1B, is omitted.

In the optical transceiver 17a according to the second embodiment, predetermined dielectric blocks 32 are arranged in the gap 23 between the substrate 20 and the host system substrate 21, and a plurality of ground pins 31 are provided around the interface pins, through which the 10-Gb/s data signal and the 10-GHz clock signal pass, to thereby match the characteristic impedance of the interface pins with that of the substrate lines. As a result, deterioration in the transmission characteristic is suppressed, when the 10-Gb/s data signal and the 10-GHz clock signal are transmitted.

In the configuration of the second embodiment, the 10-Gb/s data signal and the 10-GHz clock signal are transmitted in the following manner.

When the optical transceiver 17a transmits the 10-Gb/s data signal and the 10-GHz clock signal to the system substrate 21, the receiving circuit 5 outputs the 10-Gb/s data signal and the 10-GHz clock signal. The output signals are transmitted to the substrate lines 10d, and further transmitted to the interface pins 12c.

When the optical transceiver 17a receives the 10-Gb/s data signal and the 10-GHz clock signal from the system substrate 21, the 10-Gb/s data signal and the 10-GHz clock signal from the system substrate 21 are input to the substrate 20 via the interface pins 12a. After the transmission line has been changed from the interface pins 12a to the substrate lines 10b, the signals are transmitted in the substrate 20.

In the second embodiment, dielectric blocks 32 of the same material as that of the substrate 20 or those having a dielectric constant slightly smaller than that of the substrate 20 are arranged in the gap 23 between the substrate 20 and the system substrate 21, to thereby match the characteristic impedance of the substrate lines 10 with the characteristic impedance of the interface pins 12a. As a result, the 10-Gb/s data signal and the 10-GHz clock signal are transmitted from the interface pins 12a to the substrate lines 10b, with less deterioration in the transmission characteristic. The transmitted signals are input to the laser diode driver 2.

When the respective interface pins 12a (or 12c) are linearly arranged, the characteristic impedance thereof generally tends to become higher than that of the substrate lines, and if the pin diameter d of the interface pins 12a (or 12c) is smaller than the pitch D between pins, it may be difficult to match the characteristic impedance thereof with that of the substrate lines, even if the gap 23 is filled with the dielectric blocks 32.

Therefore, in the second embodiment, a plurality of ground pins 31 are added around the interface pins 12a and 12c, in addition to the ground pins 13, so as to match the characteristic impedance thereof with that of the substrate lines 10b.

As a result, the 10-Gb/s data signal and the 10-GHz clock signal are transmitted to the substrate 20, with deterioration in the transmission characteristic being suppressed. This is particularly effective, when the pin diameter d of the interface pins 12a and 12c is smaller than the pitch D between pins.

When it is specified that the pitch D between pins is 2.54 mm, the diameter d of the pin is 1.27 mm, and the characteristic impedance Z is 50Ω, and the ground pins 13 are only arranged adjacent to the interface pins 12, the dielectric blocks 32 having a dielectric constant $\in$ of 4.33 becomes necessary according to the following equation (2).

On the other hand, when a plurality of (in this case, four) ground pins 31 are respectively added around the interface pin 12, in addition to the ground pins 13 adjacent to the interface pins 12, the following equation (3) is applied, and in this case, the dielectric blocks 32 having a dielectric constant $\in$ of 3.1 mm may be used. When six ground pins 31 are arranged at an equal distance from each interface pin so as to surround the circumference of each interface pin 12, the following equation can be used as an approximate, and the grounding ability can be further strengthened.

$$d = \frac{D \cdot 159}{10^{\left(z \cdot \frac{\sqrt{a}}{207}\right)}} \quad (2)$$

$$d = \frac{1.14 \cdot \sqrt{2}}{10^{\left(z \cdot \frac{\sqrt{a}}{173}\right)}} \cdot D \quad (3)$$

wherein in the equation (3), D denotes a pitch between the interface pin 12 and the ground pin 31.

In both cases when the dielectric blocks 32 are put between the substrates and when the dielectric blocks 32 are put therebetween and the ground pins 31 are provided around the interface pins 12, the characteristic impedance Z can be made 50Ω. However, when the ground pins 31 are provided around the interface pins 12, the dielectric constant of the dielectric block 32 to be filled in the gap 23 can be lowered. As a result, the cost for the substrate of the dielectric block can be reduced, and hence it is more effective.

Figure 6:
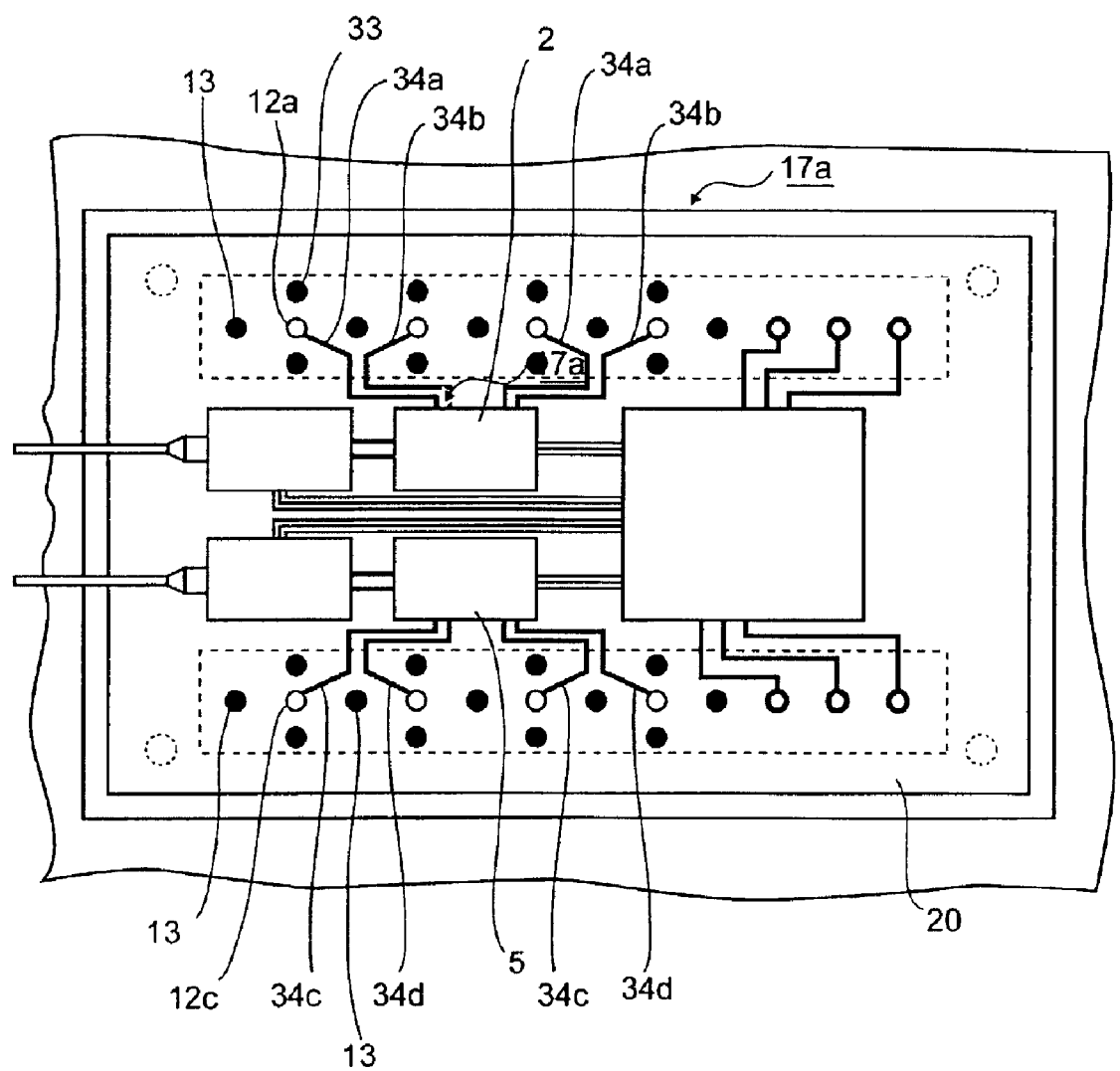
FIG. 6 is a plan view that shows a modification of the optical transceiver according to the second embodiment.

FIG. 6 is a plan view that shows a modification of the second embodiment shown in FIGS. 5A and 5B. In this modification, the substrate lines 34a and 34b for connecting the high speed interface pins 12a and the laser diode driver 2, and the substrate lines 34c and 34d for connecting the high speed interface pins 12c and the receiving circuit 5 are differential lines, in which signals in positive phase and negative phase are respectively transmitted.

Therefore, the signal transmitted on the substrate 20 becomes strong against noise, and as a result, influence of noise can be suppressed in the signal processing in the laser diode driver 2, or in the signal processing in the system substrate 21, by the signal transmission between the interface pins 12a and the laser diode driver 2, or by the signal transmission between the interface pins 12c and the receiving circuit 5.

In the case of FIG. 6, the ground pins 13 and the ground pins 33 are used in common, and four ground pins are arranged at an equal distance around the interface pins 12a and 12c. This is desirable in view of the configuration in which the differential line 34 is divided in a V-shape symmetrically and connected to the respective interface pins 12a and 12c.

Figure 7A:
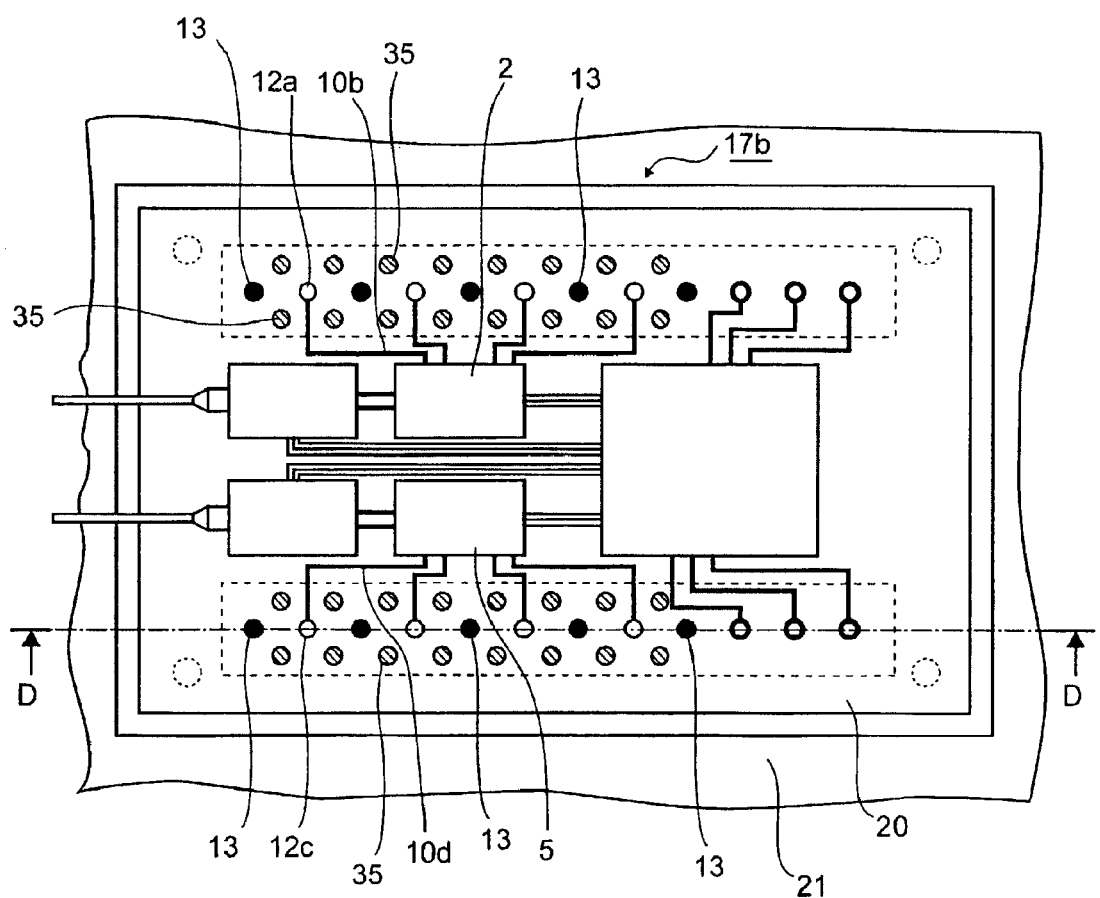
FIGS. 7A and 7B are diagrams that show an optical transceiver according to a third embodiment of the invention.
Figure 7B:
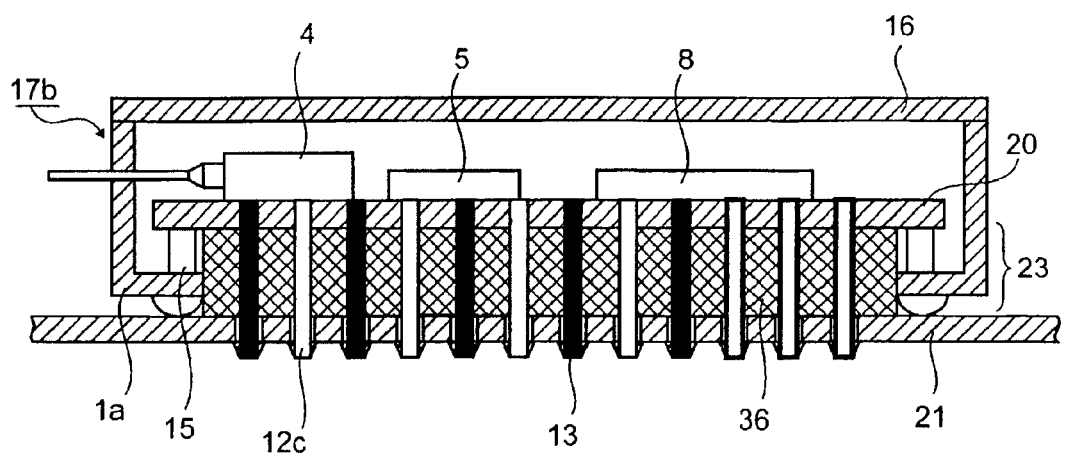

A third embodiment of the invention will be explained, with reference to FIGS. 7A, 7B and FIG. 8. FIGS. 7A and 7B are diagrams that show how an optical transceiver 17b in the third embodiment and the system substrate 21 are connected to each other. Precisely, FIG. 7A is a top view with the lid 16 removed and FIG. 7B is a sectional side view taken along the line D—D shown in FIG. 7A. In FIGS. 7A and 7B, the explanation for the component, which achieves the same function as that in the first embodiment shown in FIGS. 1A and 1B or that in the second embodiment shown in FIGS. 5A and 5B, is omitted.

In the third embodiment, predetermined dielectric blocks 36 are arranged in the gap 23 between the substrate 20 and the system substrate 21, and a plurality of ground through holes 35 connected to a grounding conductor in the inner layer of the substrate are arranged around the interface pins 12a and 12c, through which the 10-Gb/s data signal and the 10-GHz clock signal pass. Thereby, the characteristic impedance of the interface pins is matched with the characteristic impedance of the substrate lines, to thereby suppress deterioration in the transmission characteristic when the 10-Gb/s data signal and the 10-GHz clock signal are transmitted.

In the configuration of the third embodiment, the 10-Gb/s data signal and the 10-GHz clock signal are transmitted in the following manner.

When the optical transceiver 17b transmits the 10-Gb/s data signal and the 10-GHz clock signal to the system substrate 21, the receiving circuit 5 outputs the 10-Gb/s data signal and the 10-GHz clock signal. The output signals are transmitted to the substrate lines 10d, and further transmitted to the interface pins 12c.

Dielectric blocks 36 of the same material as that of the substrate 20 or those having a dielectric constant similar to that of the substrate 20 are filled in the gap 23 between the substrate 20 of the optical transceiver 17b and the system substrate 21. When the interface pins 12 are linearly arranged, the characteristic impedance thereof generally tends to become higher than that of the substrate lines, and if the pin diameter of the interface pins 12 is smaller than the pitch between pins, it may be difficult to match the characteristic impedance thereof with that of the substrate lines, even if the gap 23 is filled with the dielectric blocks 36.

Therefore, in the third embodiment, the ground through holes 35 are added around the interface pins 12, and these ground through holes 35 are connected to a beta ground pattern on the substrate or in the substrate. Thereby, the characteristic impedance of the interface pins 12 is matched with the characteristic impedance of the substrate lines 10. As a result, deterioration in the transmission characteristic is suppressed, and the 10-Gb/s data signal and the 10-GHz clock signal are transmitted to the system substrate 21, without the characteristic being deteriorated. The height of the ground through holes 35 is substantially the same as that of the dielectric block 36.

When the optical transceiver 17b receives the 10-Gb/s data signal and the 10-GHz clock signal from the system substrate 21, the 10-Gb/s data signal and the 10-GHz clock signal transmitted from the system substrate 21 are transmitted to the substrate 20 via the interface pins 12a. After the transmission line has been changed from the interface pins 12a to the substrate lines 10b, the signals are transmitted in the substrate 20.

Dielectric blocks of the same material as that of the substrate 20 or those having a dielectric constant similar to that of the substrate 20 are filled between the substrate 20 of the optical transceiver 17b and the system substrate 21, and the through holes 35 are added around the interface pins 12, so that the characteristic impedance of the interface pins 12 is matched with that of the substrate lines 10b. Therefore, the 10-Gb/s data signal and the 10-GHz clock signal are transmitted to the substrate lines 10b, with deterioration in the transmission characteristic suppressed. The transmitted signals are input to the laser diode driver 2.

In this third embodiment, since the ground is constituted using through holes, the cost can be reduced as compared with the second embodiment.

Figure 8:
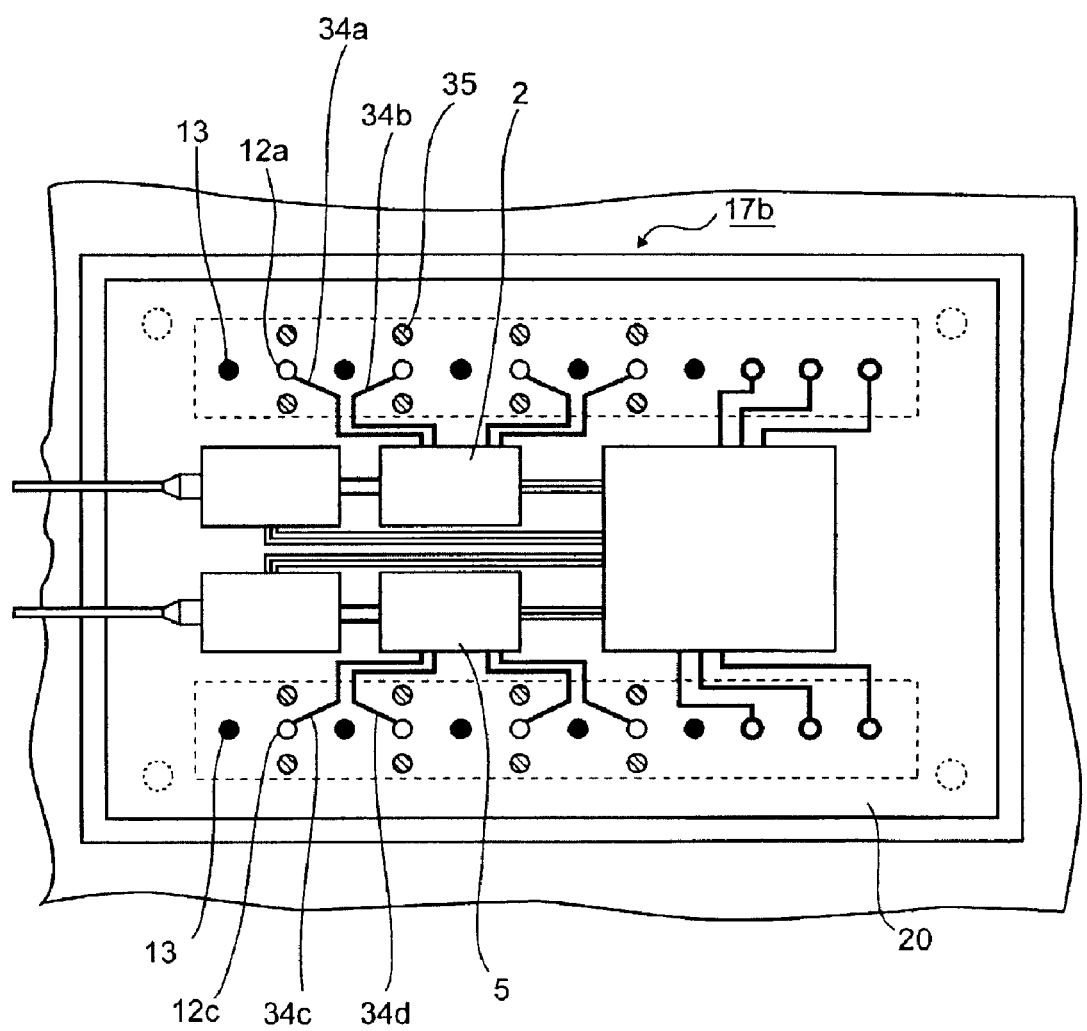
FIG. 8 is a plan view that shows a modification of the optical transceiver according to the third embodiment.

FIG. 8 is a plan view that shows a modification of the third embodiment shown in FIGS. 7A and 7B. In this modification, the substrate lines 34a and 34b for connecting the high speed interface pins 12a and the laser diode driver 2, and the substrate lines 34c and 34d for connecting the high speed interface pins 12c and the receiving circuit 5 are differential lines, in which signals in positive phase and negative phase are respectively transmitted.

Therefore, the signal transmitted on the substrate 20 becomes strong against noise, and as a result, influence of noise can be suppressed in the signal processing in the laser diode driver 2, or in the signal processing in the system substrate 21, by the signal transmission between the interface pins 12a and the laser diode driver 2, or by the signal transmission between the interface pins 12c and the receiving circuit 5.

A fourth embodiment of the invention will be explained, with reference to FIG. 9 to FIG. 19. The fourth embodiment is related to an optical transmitter 40 mounted inside a housing cover. This optical transmitter 40 performs only transmission. In other words, the fourth embodiment does not have an optical receiver.

Figure 9:
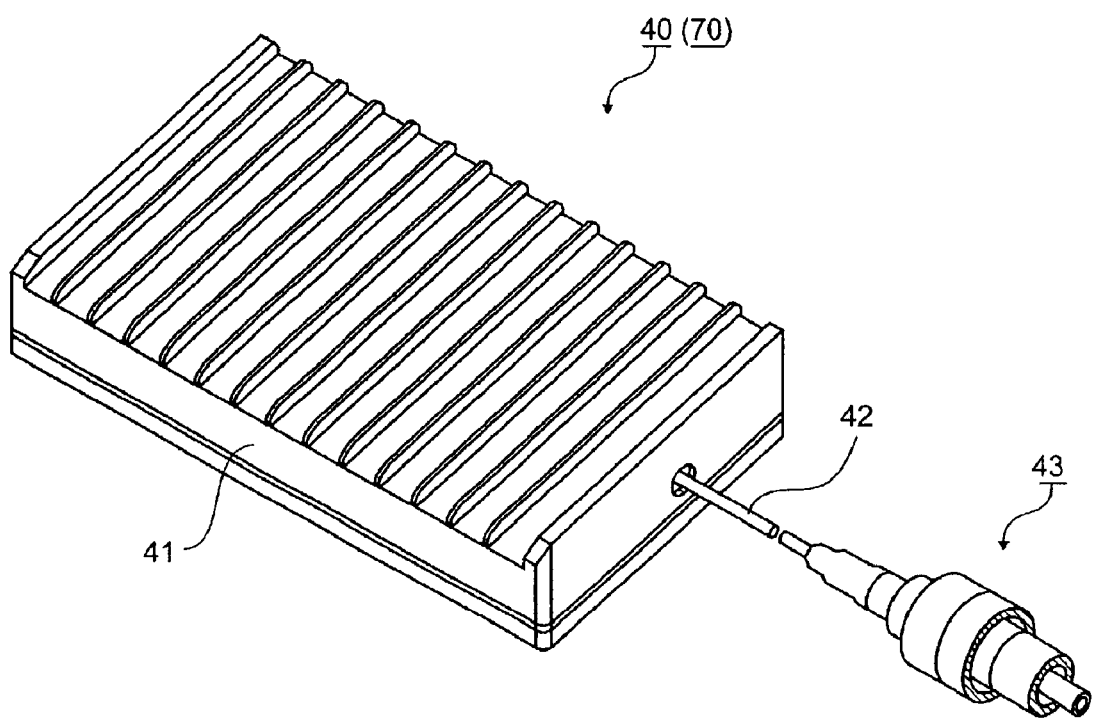
FIG. 9 is a perspective view that shows the appearance of an optical transmitter according to a fourth embodiment of the invention.
Figure 10A:
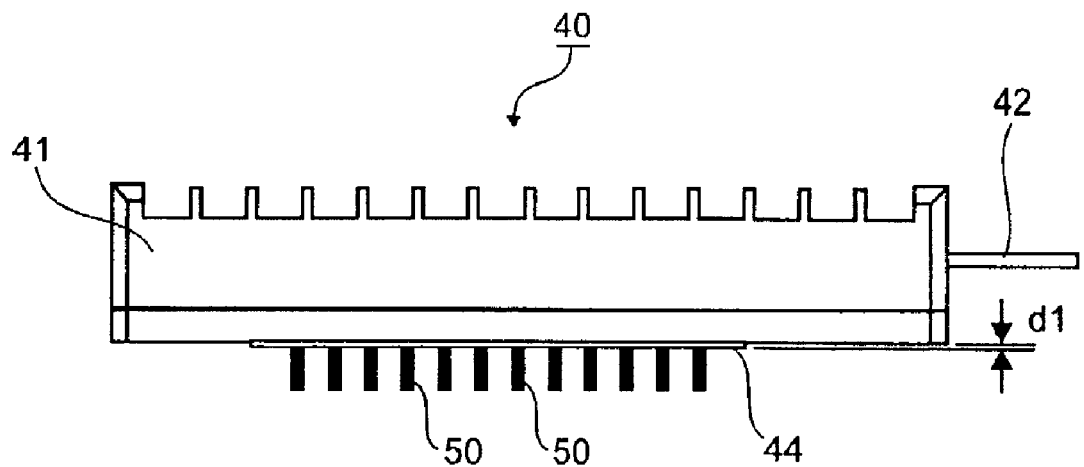
FIGS. 10A and 10B are diagrams that show the optical transmitter according to the fourth embodiment.
Figure 10B:
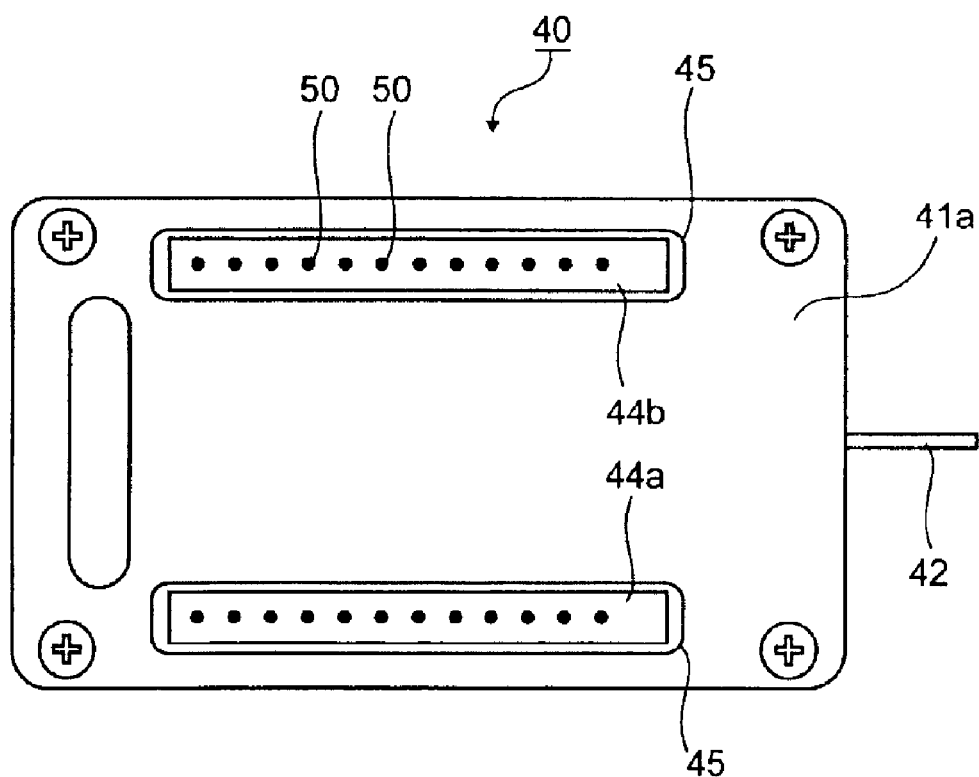

FIG. 9 is a perspective view that shows the appearance of the optical transmitter 40. FIG. 10A is an elevational view that shows the appearance of the optical transmitter 40 and FIG. 10b is a bottom view thereof. This optical transmitter 40 has a substrate and dielectric blocks as shown in the first embodiment, built in a rectangular metal housing cover (case) 41 attached with a heat sink on the upper plate thereof. An optical fiber 42 for transmission protrudes from the front plate of the case 41. An optical connector 43 such as an FC connector (corresponding to an F01 single-core optical fiber) and an SC connector (corresponding to an F04 single-core optical fiber) is connected to the optical fiber 42 for transmission. A pair of long holes 45, into which a pair of dielectric blocks 44 are inserted, are formed on the bottom plate 41a of the case 41, at the edge on the long side of the bottom plate 41a. As shown in FIG. 10A, a pair of dielectric blocks 44a and 44b protrude downwards by only a small dimension d1 (in this case, 0.5 mm), from the bottom face of the case 41 via the long holes 45. Twelve pins 50 protrude downwards, respectively, from the respective dielectric blocks 44a and 44b.

Figure 11C:
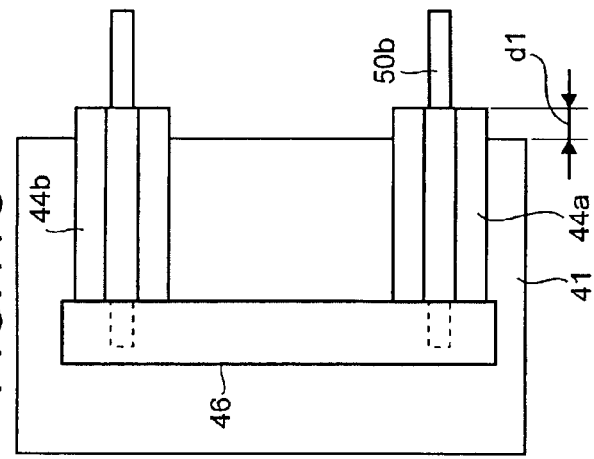
FIGS. 11A to 11C are diagrams that show the inner structure of the optical transmitter according to the fourth embodiment.
Figure 11A:
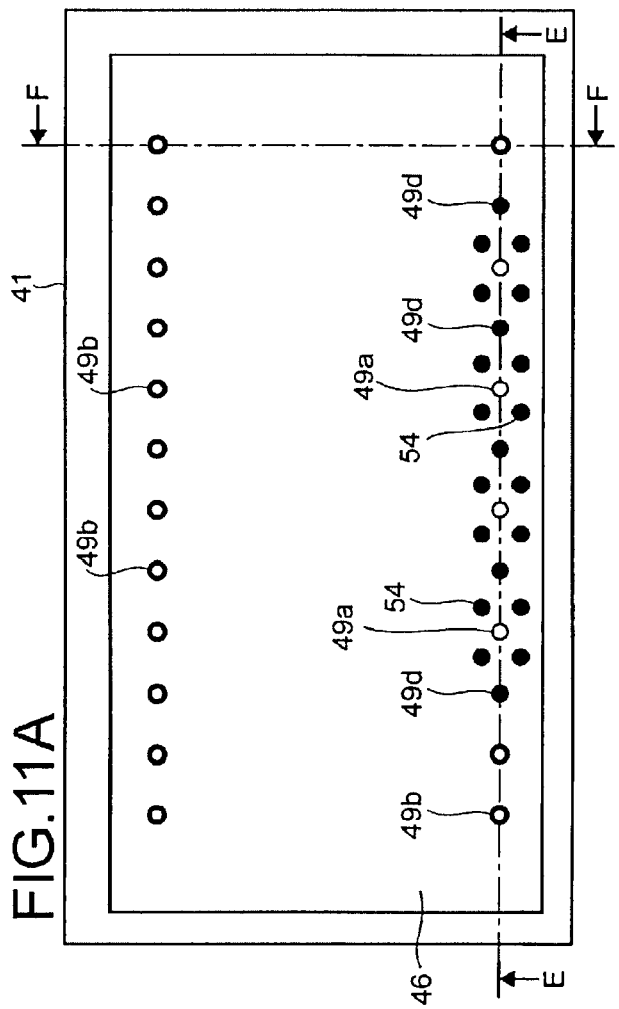
Figure 11B:
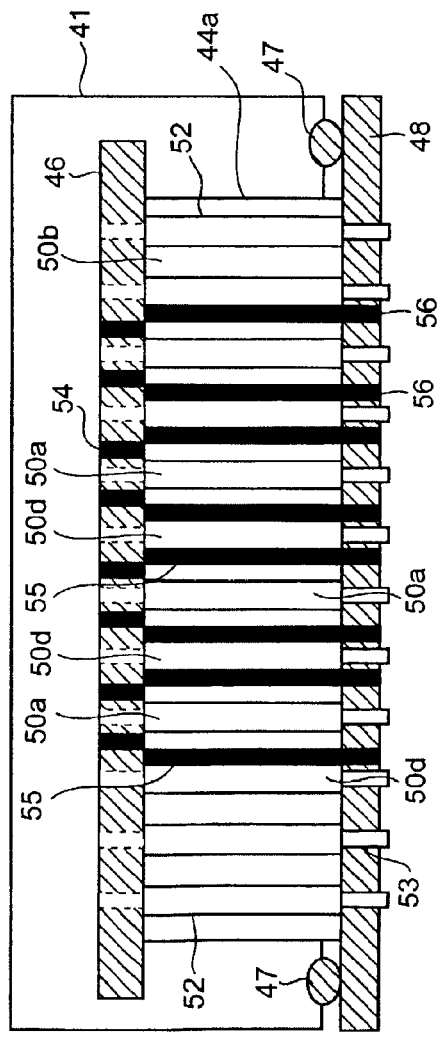
Figure 12:
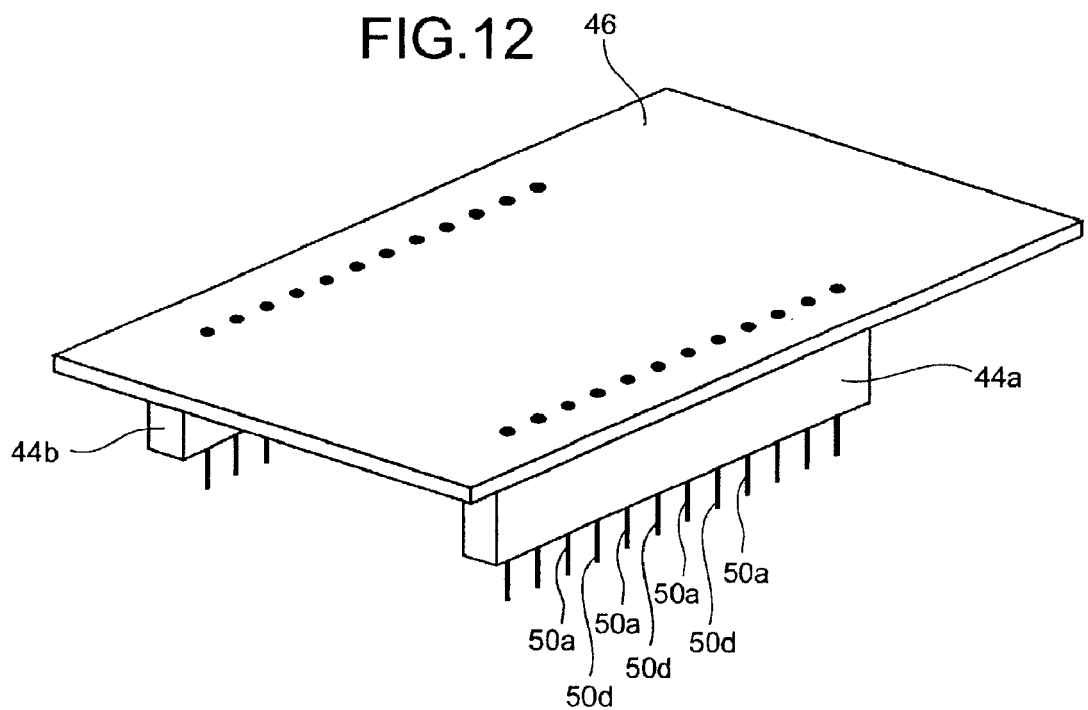
FIG. 12 is a perspective view that shows a substrate unit used in the optical transmitter according to the fourth embodiment.

FIGS. 11A to 11C are schematic diagrams that show how the optical transmitter 40 and a system substrate 48 are connected to each other. FIG. 11A is a top view, with the upper plate of the case 41 removed, FIG. 11B is a sectional view taken along the line E—E shown in FIG. 11A, and FIG. 11C is a sectional view taken along the line E—E shown in FIG. 11A. FIG. 12 shows a substrate unit, in which a pair of dielectric blocks 44a and 44b, into which a plurality of pins 50 is inserted, are mounted on an internal substrate 46.

In FIGS. 11A to 11C, the internal substrate 46 (corresponding to the substrate 20 in the first to third embodiments) is supported by a substrate holding member 15 (not shown) and fixed to the case 41, as in the first embodiment. The laser diode driver, the laser diode module having a laser diode provided therein, and ICs such as a control circuit including a power supply circuit and various control units are mounted on the internal substrate 46.

A plurality of protrusions 47 consisting of an elastic body or a metal is provided on the backside of the bottom plate 41a of the case 41. Since the protrusions 47 abut on the system substrate 48, the case 41 is stably seated on the system substrate 48 (corresponding to the system substrate 21 in the first to third embodiments). In this manner, in the optical transmitter 40 in the fourth embodiment, the optical transmitter 40 and the system substrate 48 abut on each other via the protrusions 47 and the bottom sides of the dielectric blocks 44a and 44b. If the protrusions 47 do not exist, the weight of the case 41 is directly applied to the internal substrate 46 via the dielectric blocks 44a and 44b. If there is a problem in the mechanical strength of these structures, the protrusions 47 should not be omitted. However, when the mechanical strength of the case 41, the dielectric blocks 44 and the internal substrate 46 is sufficient, the protrusions 47 may be omitted.

Twelve pin holes 49a, 49b and 49d, to which the twelve pins 50 (50a, 50b and 50d) provided in the two dielectric blocks 44 are press-fitted, are formed in the internal substrate 46, at the respective edges on the long side thereof. These pin holes are formed substantially at equal intervals.

In FIG. 11A, one ends of four high speed interface pins 50a, which can transmit data signals (two) and clock signals (two), including the high-frequency signal, are press-fitted to four pin holes for high speed 49a (white circles) formed on the lower side in the page. One ends of low speed interface pins 50b for supplying low-frequency control signals and dc voltage are press-fitted to pin holes for low speed 49b. One ends of the ground pins 50d for grounding are press-fitted to ground pin holes (black circles) 49d.

In FIG. 11A, the arrangement of twelve pin holes formed on the lower side is in the following order as seen from the left: two pin holes for low speed 49b, one ground pin hole (black circle) 49d, one pin hole for high speed 49a, one ground pin hole (black circle) 49d, one pin hole for high speed 49a, one ground pin hole (black circle) 49d, one pin hole for high speed 49a, one ground pin hole (black circle) 49d, one pin hole for high speed 49a, one ground pin hole (black circle) 49d, and one pin hole for low speed 49b.

Four ground through holes 54 are respectively formed in the internal substrate 46, around each of the pin holes for high speed 49a, for matching the characteristic impedance.

In FIG. 11A, in the arrangement of twelve pin holes formed on the upper side, pin holes for low speed 49b and the ground pin holes (black circles) 49d are properly mixed, but it is not particularly important in the present invention. Therefore, all are shown as pin holes for low speed 49b.

In each of the dielectric blocks 44a and 44b, twelve holes 52 are respectively provided for inserting the high speed interface pins 50a, the low speed interface pins 50b and the ground pins 50d. The large-diameter portions of the high speed interface pins 50a, the low speed interface pins 50b and the ground pins 50d are inserted into these holes 52, corresponding to the pin arrangement in the internal substrate 46. Therefore, the number of pins in each of the dielectric blocks 44a and 44b becomes 12, as shown in FIG. 12. In the dielectric block 44a, four ground through holes 55 are respectively formed around the high speed interface pins 50a.

In order to satisfy the characteristic impedance 50Ω at all places for the high speed interface pins 50a, the pitch interval D between the ground through holes 55 and the high speed interface pins 50a is changed according to the diameter d of the signal pin 50. In other words, the large-diameter portions of the pins 50 are inserted into the dielectric blocks 44a and 44b, and the ends of small-diameter of the pins 50 are inserted into the internal substrate 46. Therefore, the pitch between the pin 50 and each ground through hole 55 in the dielectric block 44a is set longer than the pitch between the pin 50 and the ground through hole 54 in the internal substrate 46, according to the equation (3).

As is seen from FIGS. 11A to 11C, the dielectric blocks 44a and 44b protrude downwards by only a small dimension d1 from the bottom face of the case 41. The environmental condition at the time of substrate operation of the pin 50 is 0 to 70° C., and as the material of the pin 50, a material suitable for press-fit into the pin hole 49 in the internal substrate 46 is preferable. The pins 50 are gold-plated.

Two rows of twelve pin holes 53 for inserting twelve pins 50 built in the pair of dielectric blocks 44a and 44b are formed in the system substrate 48. The length of the lower end of each pin 50 is set such that when the dielectric blocks 44a and 44b abut on the system substrate 48, the lower end of each pin 50 slightly protrudes vertically from the bottom face of the system substrate 48. As in the internal substrate 46, four ground through holes 56 are respectively formed around the four pin holes 53, to which the other ends of the high speed interface pins 50a are inserted, also in the system substrate 48. In the system substrate 48, the position of each ground through hole 56 is made the same position as that of the ground through holes 55 in the dielectric block 44. The reason will be described later.

Since the internal substrate 46 is electrically connected with the system substrate 48 via the dielectric blocks 44a and 44b via the pins 50, the signal transfer between the optical transmitter 40 and the host system device becomes possible.

The details of the internal substrate 46, the dielectric block 44a, the pins 50 and the system substrate 48 will be explained in order.

Figure 13:
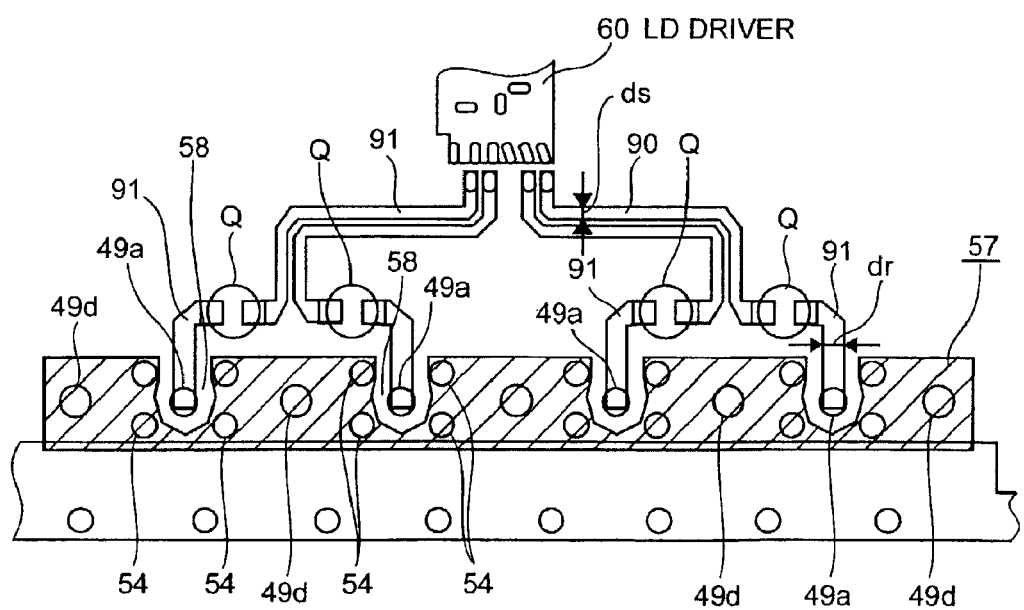
FIG. 13 is a partial plan view of an internal substrate used in the optical transmitter according to the fourth embodiment.
Figure 14:
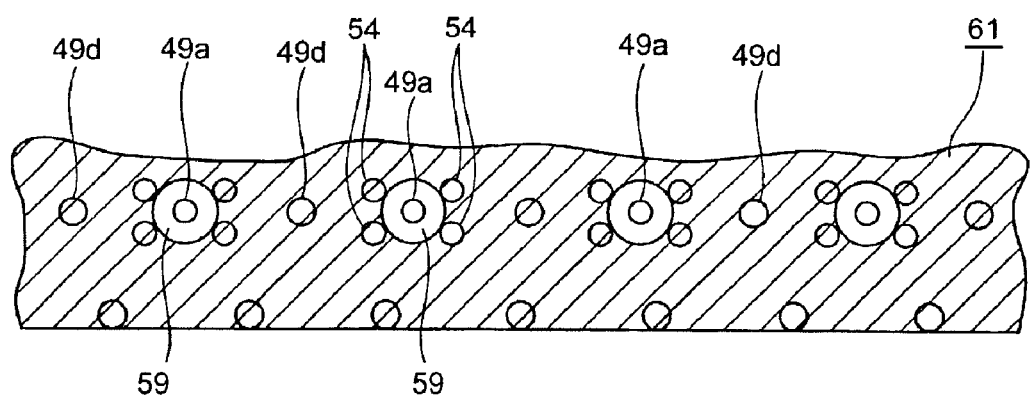
FIG. 14 is a partial bottom view of the internal substrate used in the optical transmitter according to the fourth embodiment.

The internal substrate 46 will be explained first, with reference to FIG. 13 and FIG. 14. FIG. 13 is a partial plan view that shows the right face of the internal substrate 46, and FIG. 14 is a partial plan view that shows the rear face of the internal substrate 46 (the face side abutting on the dielectric blocks 44a and 44b). In FIG. 13 and FIG. 14, the peripheral portions of the four pin holes 49a for high speed are shown in detail.

As shown in FIG. 13 and FIG. 14, four ground through holes 54 are respectively formed around the four pin holes 49a for high speed, as described above. As shown in FIG. 13, a beta ground pattern 57 (hatched portion) is formed on the right face of the internal substrate 46, so as to include the respective ground through holes 54 and five ground pin holes 49d, but to avoid the four pin holes 49a for high speed. A solder resist 58 is respectively formed around the pin holes 49a for high speed, in order to prevent contact between the solder and the beta ground pattern 57 at the time of soldering with respect to the respective pins 50.

The rear face of the internal substrate 46 is the same. As shown in FIG. 14, a beta ground pattern 61 (hatched portion) is formed on the rear face of the internal substrate 46, so as to include the respective ground through holes 54 and five ground pin holes 49d, but to avoid the four pin holes 49a for high speed. A solder resist 59 is respectively formed around the pin holes 49a for high speed.

The four pin holes 49a for high speed are for positive phase data signals, for negative phase data signals, for positive phase clock signals and for negative phase clock signals, in order from the left. These four pin holes 49a for high speed are connected to the laser diode driver 60 via the substrate lines. As described above, the laser diode driver 60 generates a modulation signal Im (pulse signal) for driving the laser diode module (not shown), based on the input data signal and clock signal.

In this case, the substrate lines between the laser diode driver 60 and the four pin holes 49a for high speed are differential transmission lines 90. The differential transmission lines 90 are for generating electromagnetic coupling by making the laser diode driver 60 and the four pin holes 49a for high speed close to each other as much as possible for a noise counter plan. On the other hand, the high speed interface pin 50a is a single-end (disproportionate type) transmission line. Therefore, it is necessary to ensure a certain interval between the pin holes 49a for high speed, to which the high speed interface pins 50a are inserted, so that signal interference does not occur.

Therefore, the pattern lines 91 as a connecting portion between the differential transmission lines 90 and two sets of high speed interface pins 50a are arranged with a large interval, and has a pattern width dr larger than a pattern width ds of the differential transmission lines 90 (dr>ds), so that the characteristic impedance approaches 50Ω.

In this case, the wiring pattern lines 91 are bent substantially at a right angle, but the opposite ends thereof may be made gradually away from each other, by using a Y-shape or the like. The pattern width may be made abruptly small, so long as deterioration in the reflection characteristic does not occur, or if deterioration in the reflection characteristic occurs, the pattern width may be made gradually small. The ground pattern 57 has a U-shaped notch, so as not to touch the wiring pattern line 91.

Capacitors that cut the bias voltage are respectively provided in the middle of the wiring pattern line 91 (at a point Q in the figure). These capacitors are inserted, taking into consideration a difference between a bias voltage used for the laser diode driver 60 and a bias voltage for ICs on the system substrate 48, to which each line is connected. The bias voltage is cut by these capacitors and a voltage amplitude signal is output to the laser diode driver 60. Therefore, if the bias voltage of the laser diode driver 60 and the ICs on the system substrate 48 is the same, these capacitors are not required.

Figure 15:
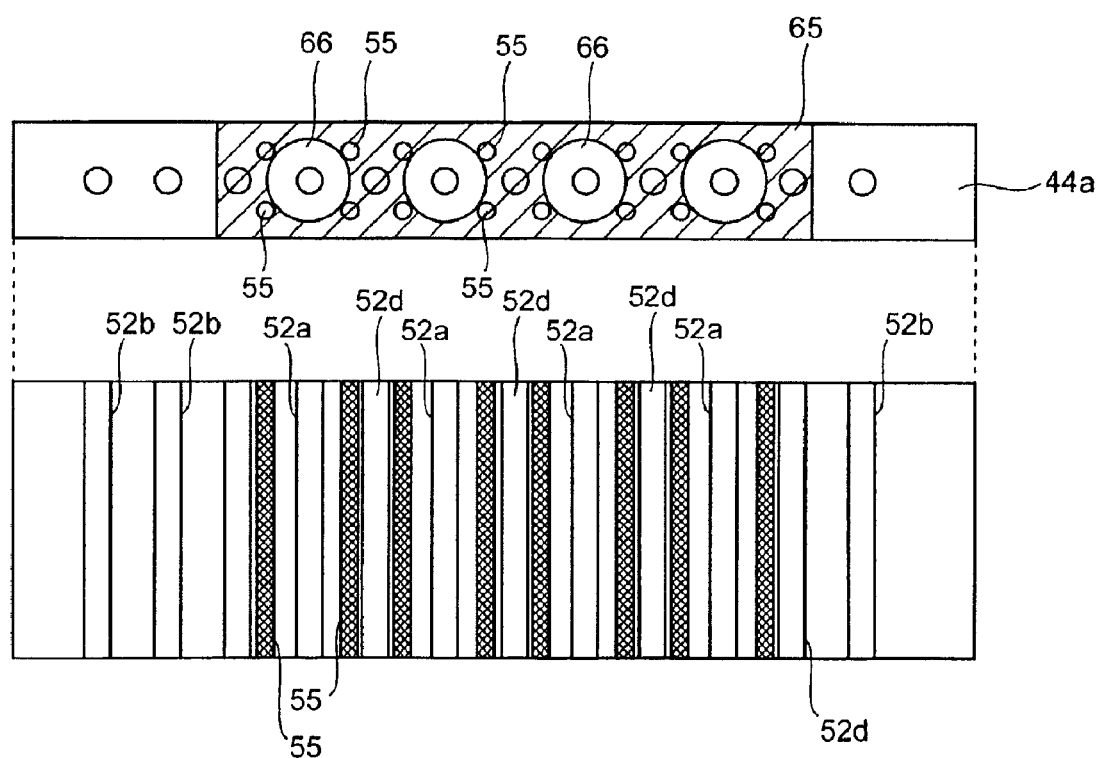
FIG. 15 is a plan view (upper one) and a cross section (bottom one) that show a dielectric block used in the optical transmitter according to the fourth embodiment.

The dielectric block 44a, which contains the high speed interface pins 50a, will be explained with reference to FIG. 15. As shown in FIG. 15, four pin holes 52a for high speed for inserting four high speed interface pins 50a, three pin holes 52b for low speed for inserting three low speed interface pins 50b, and five ground pin holes 52d for inserting five ground pins 50d are respectively provided in the dielectric block 44a. As described above, four ground through holes 55 are respectively formed around the four pin holes 52a for high speed.

A beta ground pattern 65 (hatched portion) is formed on the upper face and the lower face of the dielectric block 44a, so as to include the respective ground through holes 55 and five ground pin holes 52d, but to avoid the four pin holes 52a for high speed. A solder resist 66 is respectively formed around the pin holes 52a for high speed on the upper face and the lower face of the dielectric block 44a, in order to prevent contact between the solder and the beta ground pattern 65 at the time of soldering with respect to the respective pins 50a. Each of the pin holes 52a, 52b and 52d has a bore diameter of 1.0 mm, and each of the ground through holes 55 has a diameter of 0.6 mm.

For the dielectric block 44, for example, dimensions as described below are set. Two types of pitches Pm between the pin holes 52a for high speed at the center and the ground through holes 55 on the periphery thereof are set below. Further, a gap is provided between the housing case 41 and the system substrate 48, and two types of length are assumed for the dielectric block 44, for the instance when parts are arranged in this gap and for the instance when parts are not arranged therein.

When the pitch Pm is 1.8 mm or 2.1 mm, and parts are not arranged in the gap, height×width×length (mm) is 2.5×4.0×35.0, and when the pitch Pm is 1.8 mm or 2.1 mm, and parts are arranged in the gap, height×width×length (mm) is 6.5×4.0×35.0.

The dielectric constant in this case is 3.75 when the pitch Pm is 1.8 mm, and 4.7 when the pitch Pm is 2.1 mm. These dielectric constants can be determined based on the equation (3).

Figure 16:
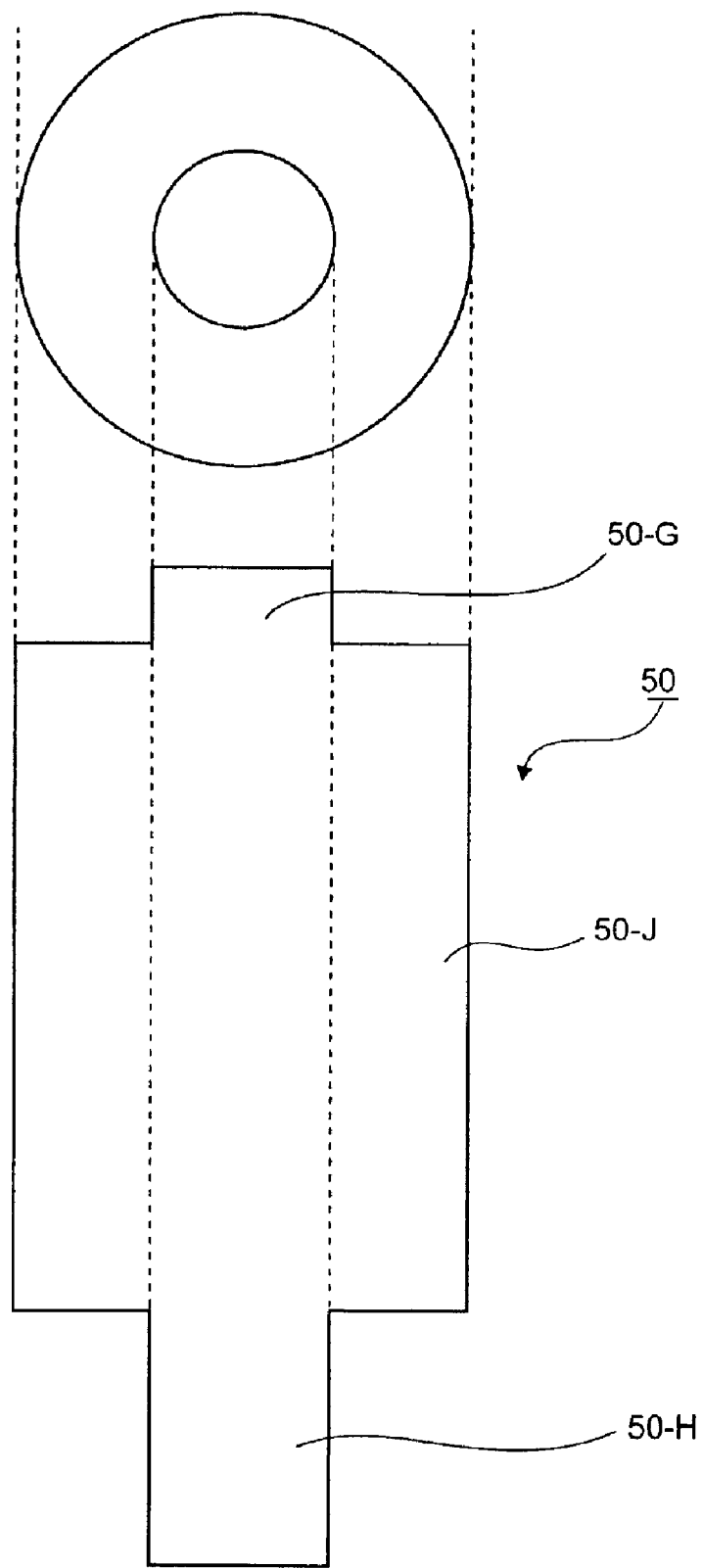
FIG. 16 is a diagram that show a pin used in the optical transmitter according to the fourth embodiment.

The pin 50 will be explained, with reference to FIG. 16. The pin 50 for electrically connecting the internal substrate 46 and the system substrate 48 has a shape such that one end 50-G to be inserted into the pin hole 49 in the internal substrate 46 and the other end 50-H to be inserted into the pin hole in the system substrate 48 have a diameter smaller than the portion that is inserted into the dielectric block 44

(large-diameter portion) 50-J. Further, the one end 50-G to be inserted into the internal substrate 46 is set shorter than the other end 50-H.

For example, the dimension of the pin 50 is set as follows. The one end 50-G has a tapered shape having a diameter of 0.46 mm to 0.51 mm, and the height is 1.6 mm. The other end 50-H has a diameter of 0.46 mm, and the height of 2.5 mm. The end 50-G has a slightly larger diameter than that of the end 50-H. The large-diameter portion 50-J has a length of from 2.0 mm to 10 mm, and a diameter of 0.8 mm. When a gap is provided between the housing case 41 and the system substrate 48, and parts are arranged in this gap, the length of the large-diameter portion 50-J of the pin 50 is set longer, for example, 6.5 mm. When parts are not arranged in the gap, the length of the large-diameter portion 50-J of the pin 50 is set to, for example, 2.5 mm.

Figure 17:
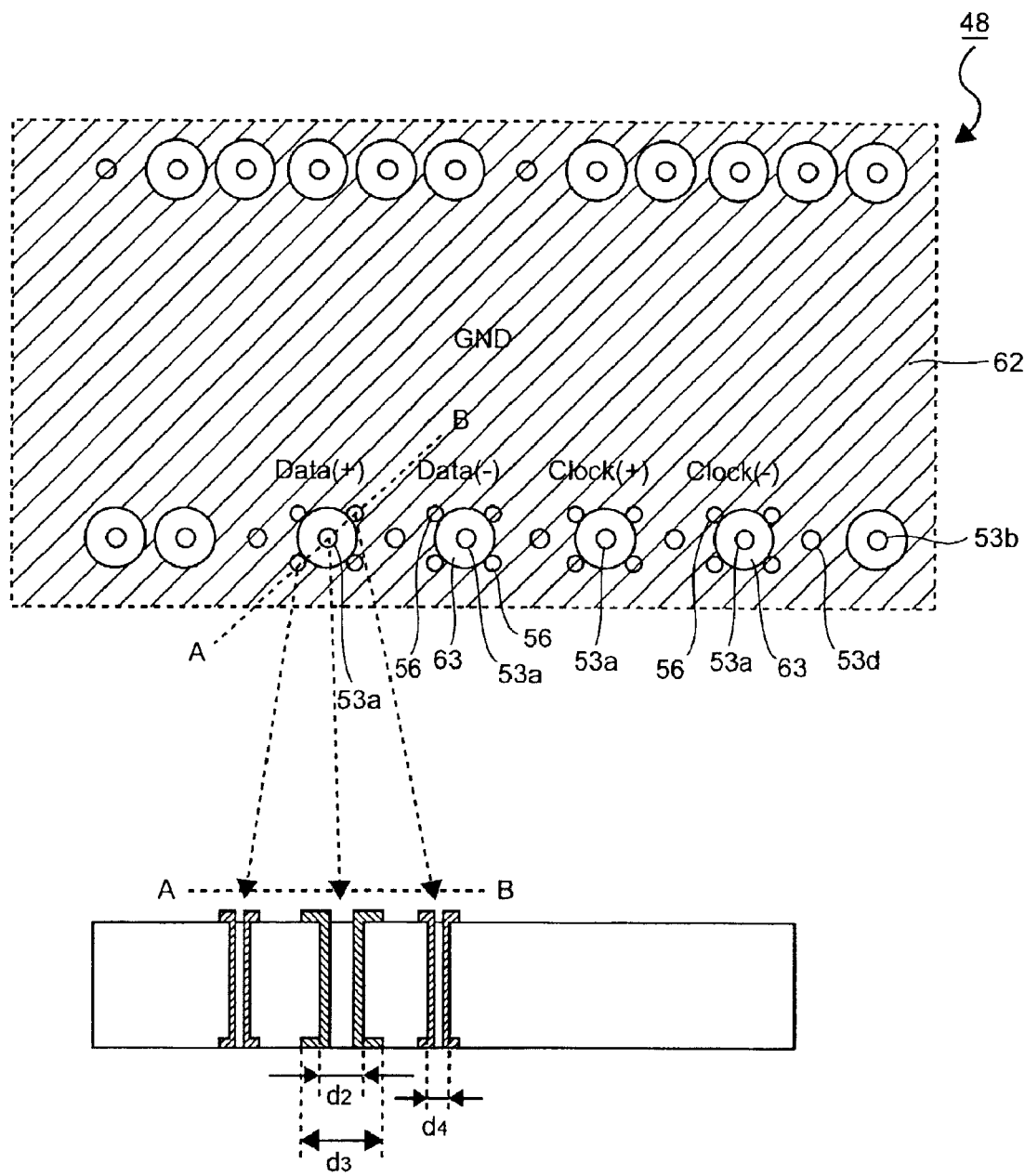
FIG. 17 is a plan view (upper one) and a cross section (bottom one) that shows a system substrate used in the optical transmitter according to the fourth embodiment.

The system substrate 48 will be explained, with reference to FIG. 17. The area surrounded by a broken line in FIG. 17 shows an area where the optical transmitter 40 is to be mounted, of the whole area of the system substrate 48. With regard to the optical transmitter mounting area surrounded by the broken line, the whole area except the pin holes into which the signal pins are inserted, or the area abutting on the dielectric blocks 44a and 44b, excluding the wiring pattern portion to be connected with the signal pin, on the right face and the rear face, is made a beta ground 62. In view of the cost or the like, it is preferable to make the former whole area the beta ground.

As shown in FIG. 17, twelve pin holes 53 (pin holes 53a for high speed, pin holes 53b for low speed and ground pin holes 53d), to which twelve pins 50 built in the dielectric block 44a are inserted, are formed on the lower side on the page of the optical transmitter mounting area. As described above, four ground through holes 56 are respectively formed around the four pin holes 53a for high speed. A solder resist 63 is respectively formed around the pin holes 53a for high speed and other pin holes, in order to prevent contact between the solder and the beta ground pattern 62 at the time of soldering with respect to the respective pins 50. The solder resist 63 is shown in the figure in a circular shape, but it may be in a U-shape, as shown in FIG. 13, in the portion where the wiring pattern connected to the pin passes through.

The four pin holes 49a for high speed are for positive phase data signals, for negative phase data signals, for positive phase clock signals and for negative phase clock signals, in order from the left. In this system substrate 48, the external shape d2 of the four pin holes 53a for high speed has a diameter of 0.8 mm, and the land size d3 is a diameter of 1.0 mm.

In other words, the external shape d2 of the pin holes 53a for high speed has a diameter substantially the same as that of the large-diameter portion 50-J of the high speed interface pins 50a. By filling a solder in the gap between the peripheral wall surface of the pin holes 53a having an outer diameter of 0.8 mm and the end 50-H of the high speed interface pins 50a, having a diameter of 0.46 mm, the diameter 0.46 mm of the end 50-H of the high speed interface pins 50a is made substantially the same as the diameter of the large-diameter portion 50-J of the high speed interface pins 50a. As a result, the characteristic impedance in this portion can be maintained at 50Ω.

The external diameter d4 of the ground through hole 56 is set to 0.6 mm. As the pitch between the pin holes 53a for high speed and the ground through holes 56, two types, 1.8 mm or 2.1 mm, are set as in the dielectric block 44a.

Figure 18:
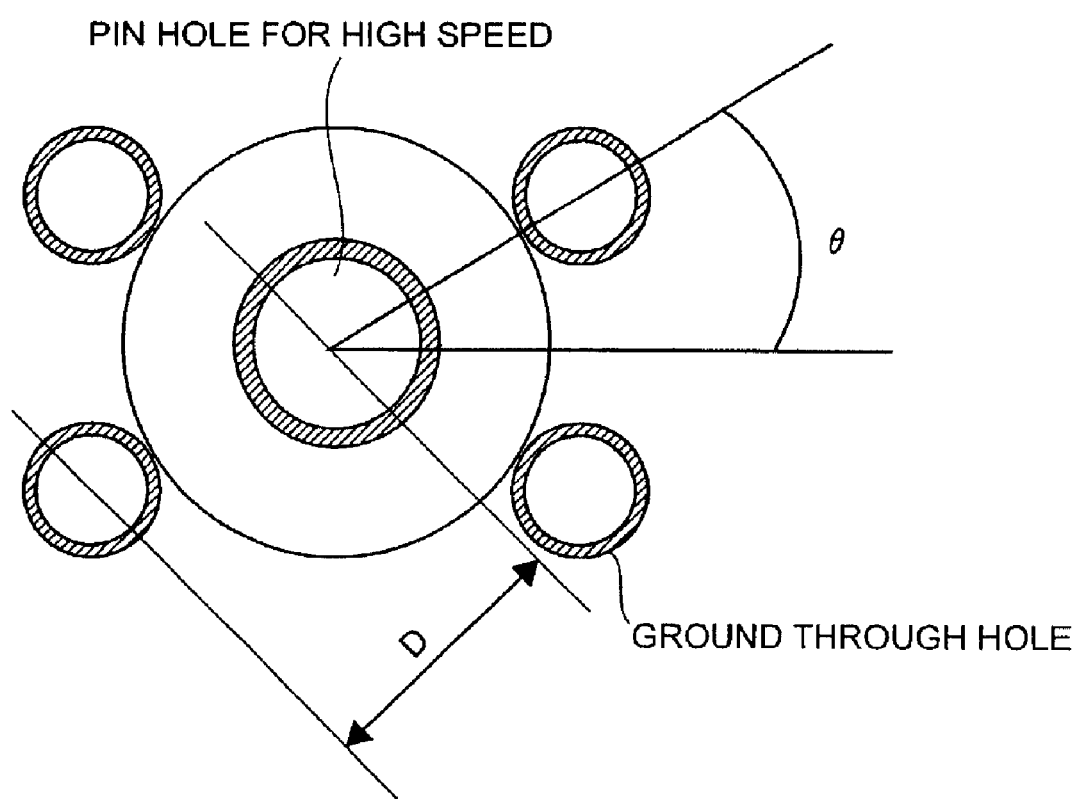
FIG. 18 is a partial plan view in an enlarged scale, that shows a system substrate used in the optical transmitter according to the fourth embodiment.

FIG. 18 shows an arrangement relationship of the pin hole for high speed in the internal substrate 46, the dielectric block 44a and the system substrate 48, and the four ground through holes on the periphery thereof. The pitch D between the pin hole for high speed and the ground through holes is set to a predetermined value (in this case, two types, that is, 1.8 mm or 2.1 mm), in order to maintain the characteristic impedance at 50Ω. When it is required to reduce the width of the dielectric block 44a, or to improve the packaging density of the respective substrates 46 and 48, while maintaining the set pitch and without deteriorating the impedance characteristic, an angle θ between a line along the row of the pin holes for high speed and a straight line connecting the pin hole for high speed and the ground through hole may be set to a value of about 30°, not to 45°, which is ideal for the impedance characteristic. By setting θ to about 30°, it becomes possible to reduce the width of the dielectric block 44a, and to improve the packaging density of the respective substrates 46 and 48, while satisfying the requirement with respect to the impedance characteristic.

Figure 19:
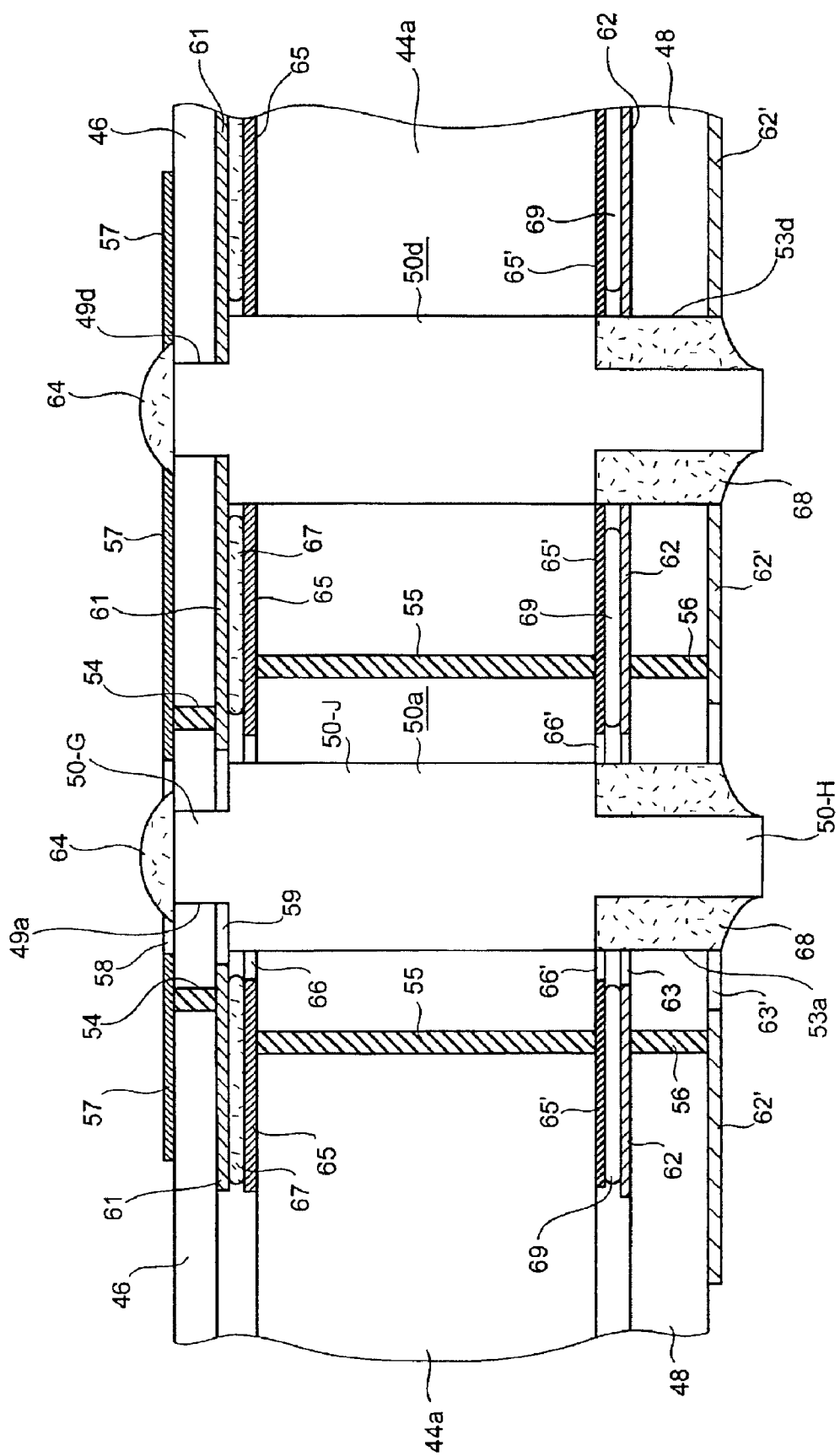
FIG. 19 is a sectional view that shows a connection structure of an internal unit of the optical transmitter according to the fourth embodiment.

The connection structure of the internal substrate 46, the dielectric block 44a and the system substrate 48 by means of the pins 50 will be explained, with reference to FIG. 19. In FIG. 19, one high speed interface pin 50a and one ground pin 50d are shown.

The connection structure of the internal substrate 46 and the pins 50 will be described first, using FIG. 19. The internal substrate 46 and the pins 50 are connected and fixed by press-fit of the ends 50-G of the respective pins 50a and 50d to the pin holes 49a and 49d in the internal substrate 46. Further, a solder 64 is applied on the surface of the end 50-G of each of the pins 50a and 50d, thereby the internal substrate 46 and the pins 50 are connected and fixed. Solder resists 58 and 59 are formed around the pin hole 49a for high speed on the right face and the rear face of the internal substrate 46, except an area of a size sufficient for arranging the solder 64.

By fixing the internal substrate 46 and the pins 50 by means of press-fit and soldering, the mechanical connection structure is made stronger. In the case of a connection structure between the internal substrate 46 and the pins 50 only by the solder, if heat generation of the system substrate 48 is large, heat from the system substrate 48 transmits through the pins 50 to the solder 64 on the internal substrate 46, thereby the connection strength between the internal substrate 46 and the pins 50 becomes weak. Therefore, by using press-fit and soldering, it is prevented that the connection strength becomes weak. The heat is allowed to diffuse sufficiently from the pins 50 to the internal substrate 46 and the dielectric block 44, and the soldering condition of the system substrate 48 is set to a suitable condition, so that the solder connection between the pins 50 and the wiring pattern lines 91 is not cut due to the heat applied to the solder 64.

The pin 50 has a small diameter at the opposite ends thereof, for positioning in the height direction with respect to the pin hole. As described above, it is necessary to select a diameter, which substantially agrees with the end of the pin 50 having a small diameter, for pin holes 49a and 49d in the internal substrate 46, in order to adopt the press-fit connection. Hence, the diameter of the metal portion of the end 50-G of the high speed interface pin 50a becomes smaller than that of the other portions, and hence the impedance is different from that of the other portions. Therefore, according to the equation (3), the characteristic impedance of this portion is maintained at 50Ω, by setting the pitch between the pin in this portion and the ground through hole 54 shorter than the pitch in other portions.

The ground through holes 54 formed in the internal substrate 46 are connected to the beta ground pattern 57 formed on the right face of the internal substrate 46 and the beta ground pattern 61 formed on the rear face thereof. As for the ground pin 50*d*, the end itself of the ground pin 50*d* is connected directly to the beta ground pattern 57 or the beta ground pattern 61.

The ground through holes 55 formed in the dielectric block 44 are respectively connected to the beta ground pattern 65 formed on the right face of the dielectric block 44 or a beta ground pattern 65' formed on the rear face thereof. These beta ground patterns 65 and 65' do not come in contact with the high speed interface pins 50*a* by the solder resists 66 and 66'. In the dielectric block 44, the ground pin 50*d* itself is connected directly to the beta ground patterns 65 and 65'.

The beta ground pattern 61 on the rear face of the internal substrate 46 and the beta ground pattern 65 on the upper face of the dielectric block 44 are joined by a solder 67. On the other hand, the ground pattern 65' on the lower face of the dielectric block 44 is applied with a solder resist 69, thereby preventing unexpected electrical contact with the system substrate 48, when the wiring pattern structure on the system substrate 48 side is unknown.

The connection structure between the system substrate 48 and the pins 50 will be described below. Joining of the system substrate 48 and the respective pins 50*a* and 50*d* is carried out only by a solder 68. As described above, the external shape d2 of the pin holes 53*a* for high speed is substantially the same as the diameter of the large-diameter portion 50-J of the high speed interface pins 50*a*, and a solder is filled in the gap between the peripheral wall surface of the pin hole 53*a* and the end 50-H of the high speed interface pin 50*a*. Thereby, the diameter of the end 50-H of the high speed interface pin 50*a* is made substantially the same as the diameter of the large-diameter portion 50-J, and hence the impedance in this portion is made 50Ω same as the large-diameter portion.

The ground through holes 56 formed in the system substrate 48 are connected to the beta ground pattern 62 formed on the right face of the system substrate 48 and the beta ground pattern 62' formed on the rear face thereof. Solder resists 63 and 63' are formed around the pin hole 53*a* for high speed on the right face and the rear face of the system substrate 48. As for the ground pin 50*d*, the ground pin 50*d* itself is connected directly to the beta ground pattern 62 and the beta ground pattern 62'.

The ground pattern 65' on the lower face of the dielectric block 44*a* and the ground pattern 62 on the upper face of the system substrate 48 may be joined by a solder. Alternatively, the ground patterns 62 and 62' formed on the front and rear faces of the system substrate 48 may be omitted. When the diameter of the end 50-H of the pin 50 inserted into the system substrate 48 is made the same as that of the large-diameter portion, it is still necessary to ensure a gap to be filled with a solder. Therefore, the ground through holes 56 are arranged outside than the arranged position of the ground through holes 55 in the dielectric block 44*a*, to thereby make the impedance in this portion the same as that of the other portions.

According to the fourth embodiment, the characteristic impedance of the high speed interface pins is matched with that of the substrate lines, thereby an optical transmitter that can realize high speed data transmission or clock transmission can be provided.

A fifth embodiment of the present invention will be explained, with reference to FIG. 9, and FIG. 20 to FIG. 23. The fifth embodiment relates to an optical receiver 70 (see FIG. 9) in which only the function of optical reception is mounted in one housing cover. As in the optical transmitter 40 described above, the optical receiver 70 comprises an internal substrate, a dielectric block, and pins for connecting the internal substrate and the system substrate. However, the optical receiver 70 is different in ICs mounted on the internal substrate from that of the optical transmitter 40. In addition, in the case of the optical receiver 70, the high speed signals transmitted from the receiving circuit on the internal substrate via the transmission lines on the internal substrate and the pins are only two data signals in the positive phase and the negative phase. In other words, in the optical receiver according to the fifth embodiment, the clock signal is not transmitted to the system substrate. Therefore, with regard to the optical receiver 70, only the configuration relating to the two data signals in the positive phase and the negative phase will be explained.

Figure 20:
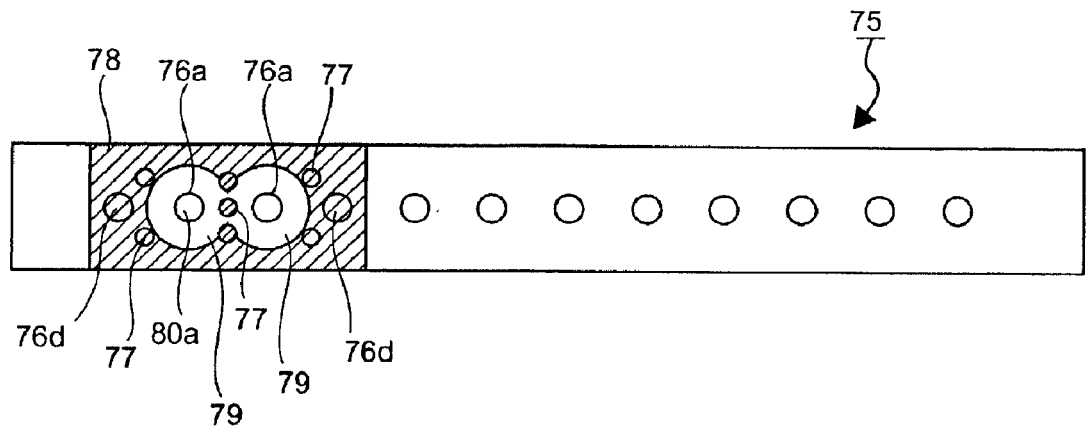
FIG. 20 is a plan view that shows a dielectric block used in an optical receiver according to a fifth embodiment of the invention.
Figure 21:
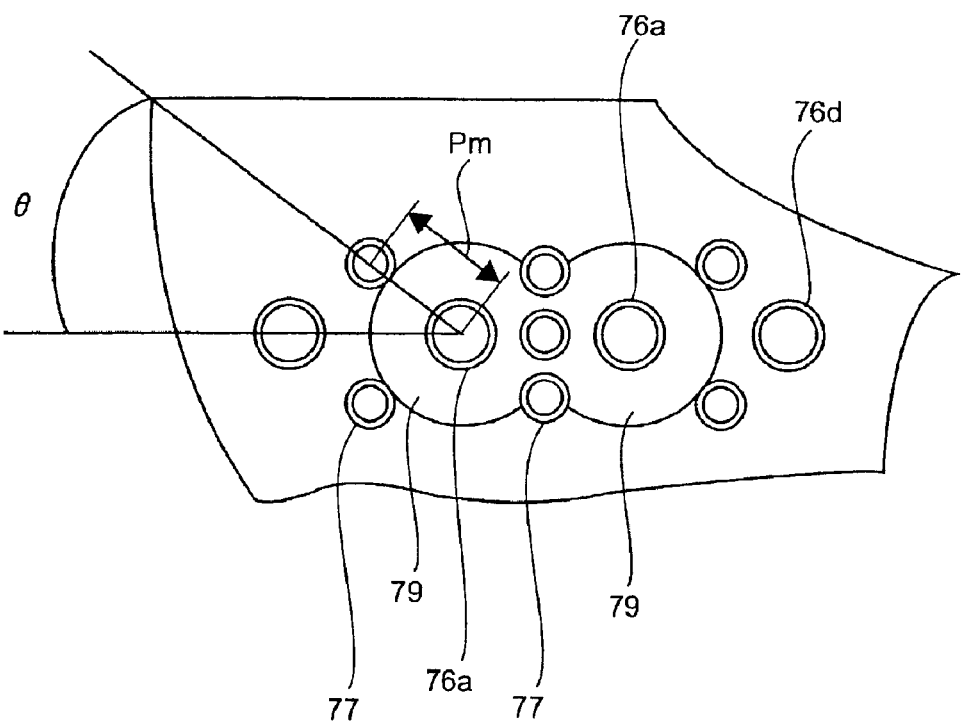
FIG. 21 is a partial plan view in an enlarged scale, that shows the peripheral structure of high speed interface pins in a dielectric block, used in the optical receiver according to the fifth embodiment.

FIG. 20 is a plan view of a dielectric block 75 in the optical receiver 70. FIG. 21 is a partial view thereof in an enlarged scale. Twelve pin holes are formed in the dielectric block 75, and twelve pins are to be inserted therein. Of these, two pins are used for the positive-phase and negative-phase data signals.

Two pin holes 76*a* for high speed for inserting two high speed interface pins 80*a* are provided in the dielectric block 75. A pin hole adjacent to the two pin holes 76*a* for high speed on the outside thereof is a ground pin hole 76*d* for the ground pin. Five ground through holes 77 are respectively formed around the two pin holes 76*a* for high speed. However, three ground through holes 77 between the two pin holes 76*a* for high speed are a shared for adjusting the characteristic impedance of the two high speed interface pins 80*a*. One ground through hole 77 is arranged on a straight line connecting the two pin holes 76*a* for high speed, thereby preventing mutual interference of the signals transmitted on the two high speed interface pins 80*a*.

As shown in FIG. 21, by setting the angle θ between a straight line connecting the pin holes for high speed and a straight line connecting the pin hole for high speed and the ground through hole to about 30°, the width of the dielectric block 75 is reduced, and the packaging density is improved, while satisfying the requirement for the impedance characteristic.

A ground pattern 78 (hatched portion) is formed on the upper and lower faces of the dielectric block 75, so as to include the respective ground through holes 77 and two ground pin holes 76*d*, but to avoid the two pin holes 76*a* for high speed. A solder resist 79 is formed around the pin holes 76*a* for high speed.

Each of the pin holes 52*a*, 52*b* and 52 has a bore diameter of 1.0 mm, and each of the ground through holes 55 has a diameter of 0.6 mm.

For the dielectric block 75, as in the dielectric block 44 of the optical transmitter 40, dimensions as described below are set. The pitch between the pin holes 76*a* for high speed at the center and the ground through holes 77 on the periphery thereof are termed as Pm.

When the pitch Pm is 1.8 mm or 2.1 mm, and parts are not arranged in the gap between the housing case and the system substrate, height×width×length (mm) is 2.5×4.0×35.0, and when the pitch Pm is 1.8 mm or 2.1 mm, and parts are arranged in the gap, height×width×length (mm) is 6.5×4.0×35.0.

The dielectric constant in this case is 3.75 when the pitch Pm is 1.8 mm, and 4.7 when the pitch Pm is 2.1 mm. A dielectric constant of about ±1.3 with respect to a dielectric constant that satisfies the characteristic impedance (50Ω) needs only to be selected, and for example, a dielectric constant of 3.48 may be set, when Pm=1.8 mm.

Figure 22:
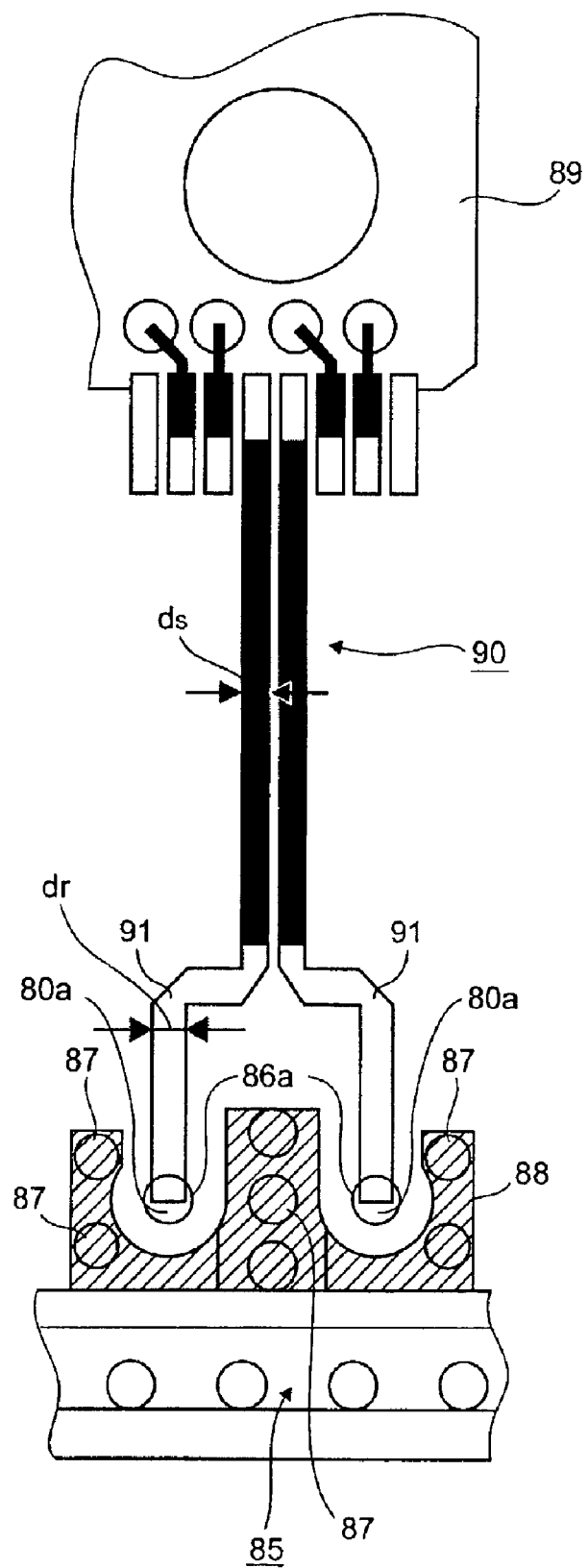
FIG. 22 is a partial plan view in an enlarged scale, that shows an internal substrate used in the optical receiver according to the fifth embodiment.

FIG. 22 is a plan view that shows a wiring pattern near the two high speed interface pins 80a in the internal substrate 85 mounted on the optical receiver 70.

Two pin holes 86a for high speed and five ground through holes 87 are formed also in the internal substrate 85, corresponding to the two pin holes 76a for high speed and five ground through holes 77 on the periphery thereof formed in the dielectric block 75. A beta ground pattern 88 is formed so as to surround the five ground through holes 87.

Two high speed interface pins 80a to be inserted into the two pin holes 76a for high speed are connected to a receiving circuit IC 89 via the substrate lines on the internal substrate 85. The receiving circuit IC 80 adjusts the amplitude of the voltage signal transmitted from the photo diode module, and outputs the voltage signal to the two high speed interface pins 80a via the substrate lines.

The two output signals in the positive phase and the negative phase from the receiving circuit IC 89 is output to the differential transmission line 90. On the other hand, the high speed interface pins 80a are respectively a single-end (disproportionate type) transmission line. Therefore, it is necessary to ensure a certain interval between the pin holes 86a for high speed, to which the high speed interface pins 80 are inserted, so that signal interference does not occur. Therefore, the pattern lines 91 as a connecting portion between the differential transmission lines 90 and two sets of high speed interface pins 80a are arranged with an interval, and have a pattern width dr larger than a pattern width ds of the differential transmission lines 90 (dr>ds), so that the characteristic impedance approaches 50Ω. In this case, the wiring pattern lines 91 are bent substantially at a right angle, but the opposite ends thereof may be made gradually away from each other, by using a Y-shape or the like. The pattern width may be changed abruptly to a small width, or may be made gradually small. The data transmitted via the high speed interface pins 80a in the single-end transmission line is transmitted in the system substrate in the single-end transmission line, or returned to the differential transmission line and then transmitted.

Figure 23:
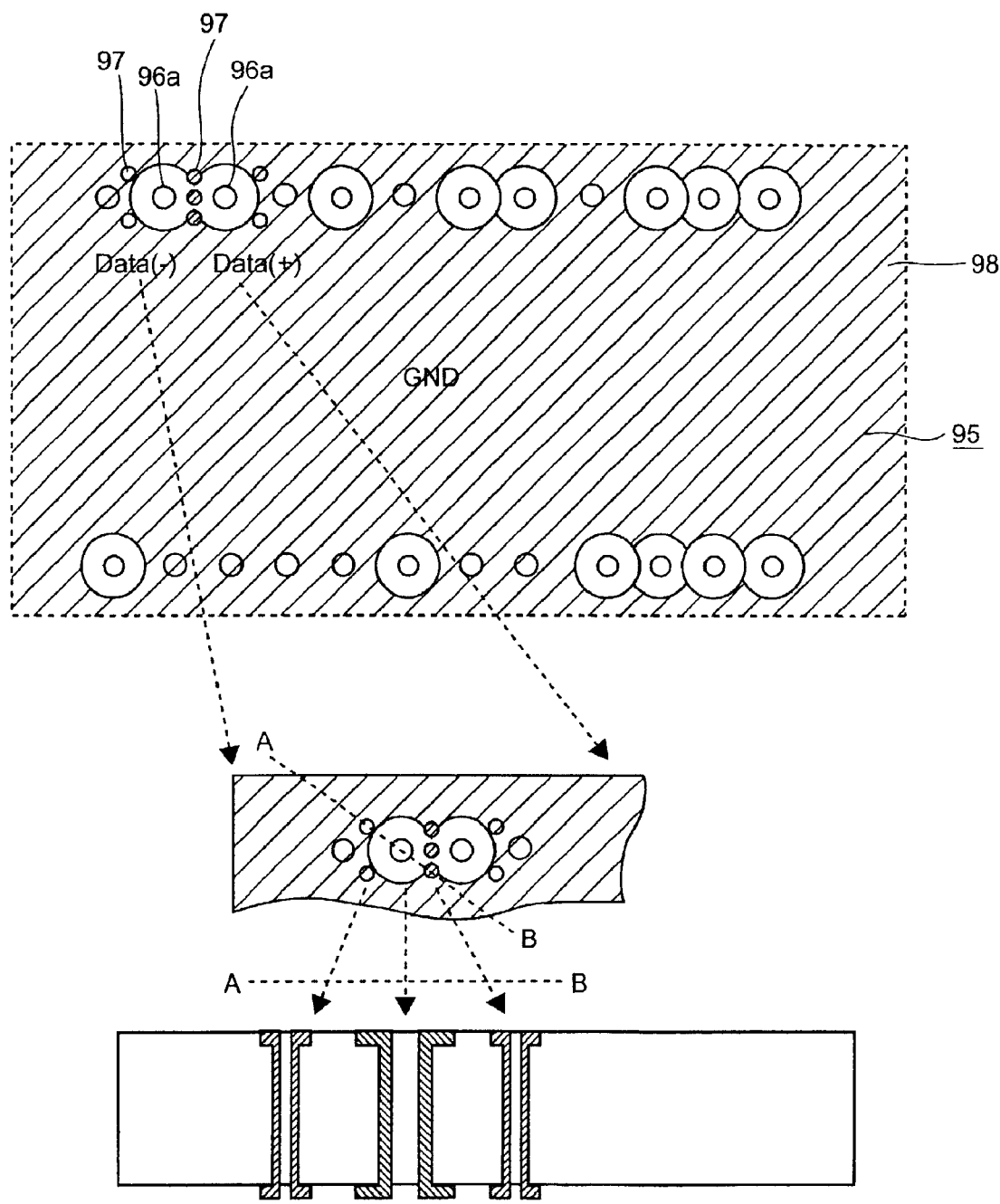
FIG. 23 is a plan view (upper one) and a sectional view (bottom one) that show a system substrate used in the optical receiver according to the fifth embodiment.

FIG. 23 is a diagram that shows a system substrate 95, to which the optical receiver is connected. The area surrounded by a broken line in FIG. 23 shows an optical receiver mounting area, in which the optical receiver 70 is to be mounted, of the whole area of the system substrate 95.

Also in the system substrate 95, two pin holes 96a for high speed and five ground through holes 97 are formed, corresponding to the two pin holes 76a for high speed and five ground through holes 77 on the periphery thereof formed in the dielectric block 75. With regard to the optical receiver mounting area surrounded by the broken line, the whole area except the pin holes into which the signal pins are inserted, or the area abutting on the dielectric blocks, excluding the wiring pattern portion to be connected with the signal pin, on the right face and the rear face, is made a beta ground 98. In view of the cost or the like, it is preferable to make the former whole area the beta ground.

As described above, according to the fifth embodiment, the characteristic impedance of the high speed interface pins is matched with that of the substrate lines, thereby an optical receiver, which realizes high speed data transmission or clock transmission, can be provided. The optical receiver 70 may be provided with two pins for transmitting clock signals, in addition to the two pins for transmitting the data signals. In this case, a clock is extracted from a voltage signal transmitted from the photo diode module by the operation of the PLL circuit provided therein, or a data signal is identified by the identification and regeneration circuit provided therein, and the regenerated data signal is output to the two high speed interface pins 80a via the substrate lines.

Figure 24:
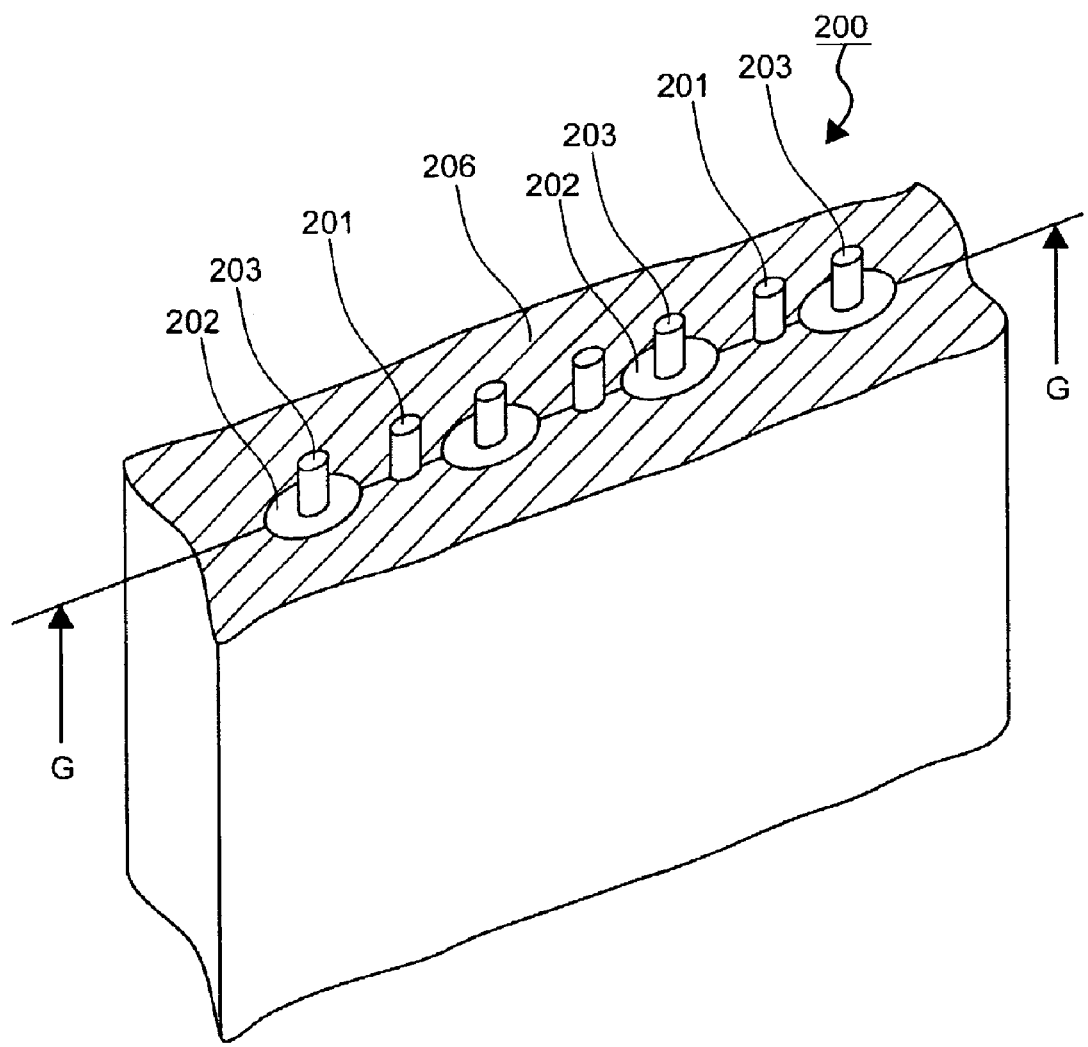
FIG. 24 is a perspective view that shows a dielectric unit in a sixth embodiment of the invention.

A sixth embodiment of the present invention will be explained below, using FIG. 24 to FIG. 26. FIG. 24 is a perspective view that shows a part of a dielectric block 200 in the sixth embodiment, FIG. 25 is a sectional view taken along the line G—G shown in FIG. 24, and FIG. 26 is a plan view of a pin portion for high-speed signals.

In the sixth embodiment, the ground through holes are not arranged intermittently around the signal pins, as in the embodiments described above, but a metal pattern for ground is formed on the whole periphery of the signal pins.

Figure 25:
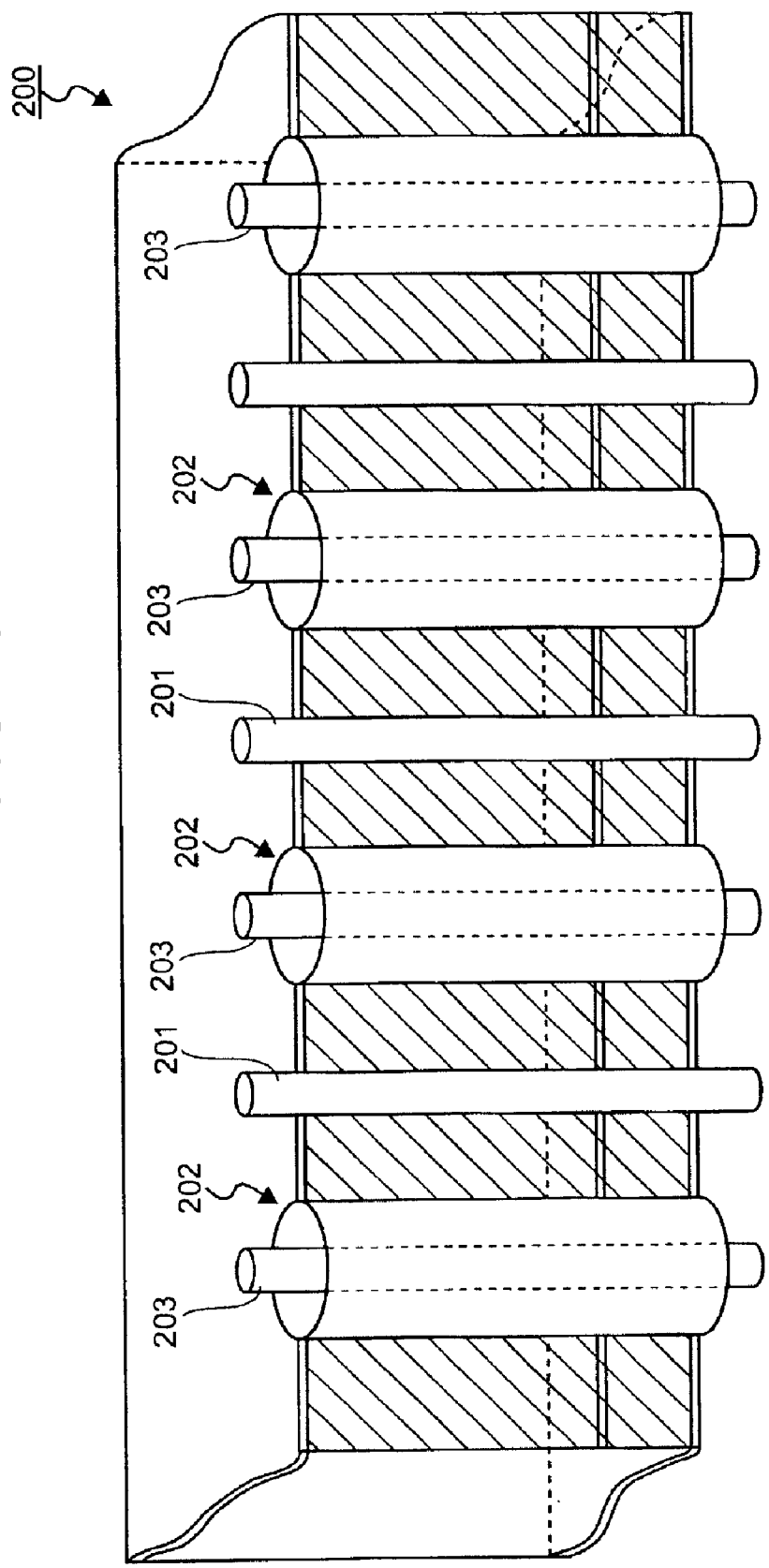
FIG. 25 is a partial sectional view that shows the dielectric unit in the sixth embodiment.
Figure 26:
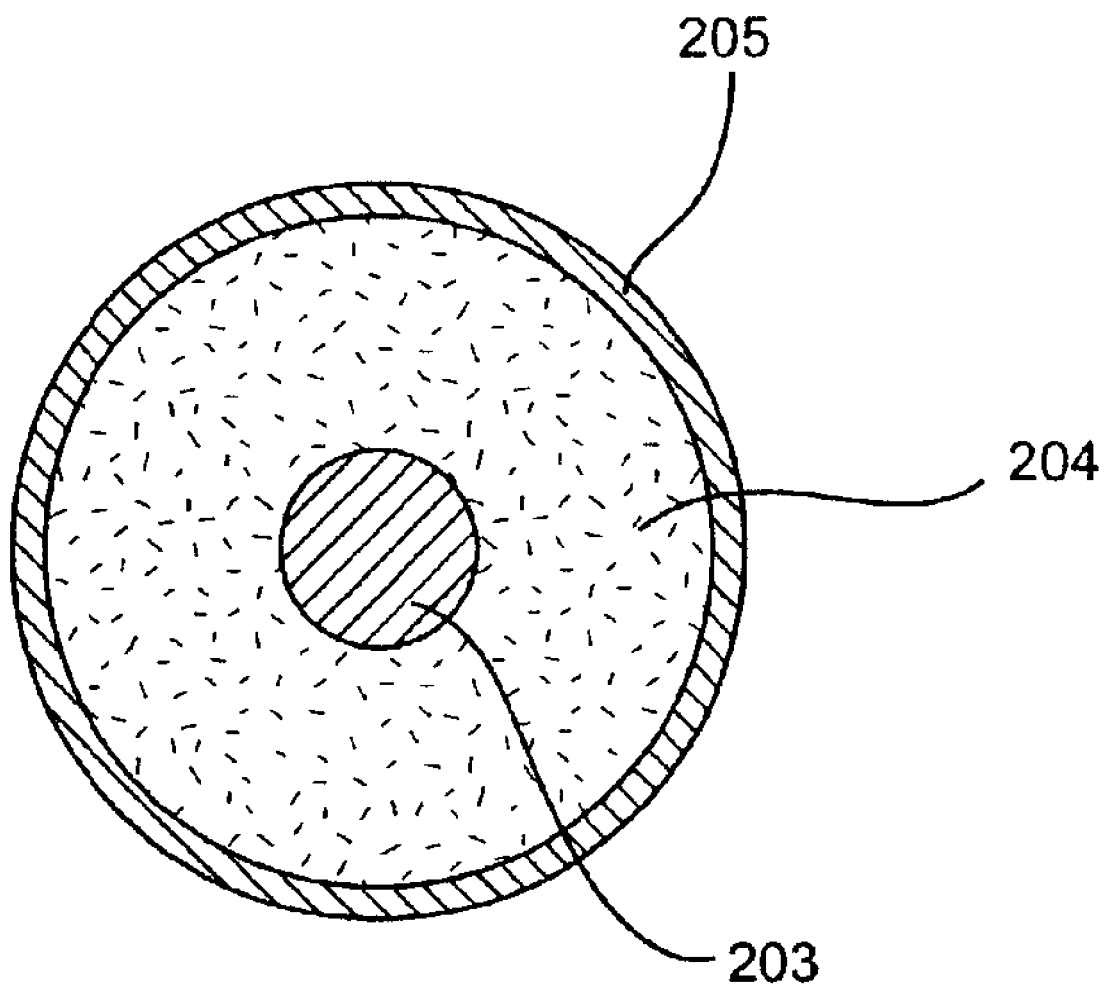
FIG. 26 is a sectional view that shows the structure of a high speed interface pin in the dielectric unit according to the sixth embodiment.

In FIG. 24 and FIG. 25, ground pins 201 and four high speed interface lines 202 arranged between these ground pins 201 are built in the dielectric block 200. As shown in FIG. 26, the high speed interface line 202 comprises an interface pin 203 for high-speed signals arranged at the center, a dielectric substance 204 on the periphery thereof, and a metal pattern 205 for ground arranged around the dielectric substance 204. A beta ground pattern 206 is uniformly formed on the upper face and the lower face of the dielectric block 200, except the portions of the signal pins 203 and the dielectric substances 204.

In order to manufacture such high speed interface lines 202 in the dielectric block 200, two manufacturing methods (A) and (B) described below may be used.

(A) First manufacturing method
Form a hole;
Apply metal plating on the inner surface of the hole, to form a metal pattern 205 for ground;
Pour a dielectric substance 204 having a hole for inserting a pin at the center thereof into the hole; and
Insert the pin 203 into the dielectric substance 204.

(B) Second manufacturing method
Form a hole;
Apply metal plating on the inner surface of the hole, to form a metal pattern 205 for ground;
Insert the pin 203; and
Pour a melt dielectric substance in between the pin 203 and the metal pattern 205.

As described above, according to the sixth embodiment, the ground through holes are not arranged intermittently around the signal pins, but the metal pattern for ground is formed on the whole periphery of the signal pins. Therefore, the ground is strengthened, thereby contributing to stabilization of the characteristic impedance.

In the above embodiments 1 to 6, the signal pins protrude from the dielectric blocks 44a and 44b, but the signal pins may protrude from either one end thereof, or may not protrude at all. When the signal pins do not protrude, the ends of the pins may be connected to the substrate side by for example a bump.

According to the optical transceiver of the present invention, the dielectric block is provided in the gap so that the characteristic impedance thereof is matched with that of the substrate line. As a result, higher speed data signal or clock signal can be transmitted. Further, since a plurality of ground pins or ground through holes are provided around the interface pins, so that the characteristic impedance of the interface pins is matched with that of the substrate line, higher speed data signal or clock signal can be transmitted by filling a dielectric block having a lower dielectric constant.

According to the connector of the invention, since the dielectric block has pins and ground through holes formed around the pins, respectively built therein, and the pins electrically connect the first and second substrates, the characteristic impedance is improved, and as a result, high speed data transmission or clock transmission can be realized between the first and second substrates.

According to the substrate unit of the invention, the substrate unit has a substrate having a connector having pins and first ground through holes formed around the pins, pin holes to which the pins are press-fitted, and second ground through holes electrically connected with the first ground through holes, around the pin holes. As a result, the characteristic impedance is improved, and high speed data transmission or clock transmission can be realized between the substrate and another substrate.

According to the optical transmitter of the invention, the optical transmitter has a connector having a plurality of signal pins, ground pins and a plurality of first ground through holes respectively formed around the signal pins, a substrate having pin holes, to which the pins are press-fitted, second ground through holes arranged around the pin holes for the signal pins, and substrate wirings connected to the pin holes for the signal pins, a laser diode mounted on the substrate, and a driver IC connected to the laser diode and the substrate wirings. As a result, the characteristic impedance of the substrate lines is matched with that of the signal pins, thereby enabling realization of high speed data transmission or clock transmission.

According to the optical receiver of the invention, the optical receiver has a connector having two high speed interface pins, ground pins, and a plurality of first ground through holes formed around the high speed interface pins, a substrate having pin holes, to which the pins are respectively press-fitted, second ground through holes arranged around the pin holes for the high speed interface pins, and substrate wirings connected to the pin holes for the high speed interface pins, a photo diode mounted on the substrate, and a receiving circuit IC connected to the photo diode and the substrate wirings. As a result, the characteristic impedance of the substrate wirings is matched with that of the signal pin, thereby enabling realization of high speed data transmission or clock transmission.

According to the semiconductor device of the invention, the ground through holes are formed around the pins in the dielectric block and around the pin holes in the first and second substrates, and a metal such as solder is filled in a gap between the peripheral wall surface of the pin hole and the pin in the second substrate. As a result, the characteristic impedance is improved, and high speed data transmission or clock transmission can be realized between the first and second substrates.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An optical transceiver including an optical transmitter and an optical receiver, the optical transceiver comprising:
   a substrate that receives or outputs an optical signal;
   a plurality of interface pins arranged in a protruding manner on one portion of the substrate, for transferring electric signals between the substrate and an external substrate;
   a dielectric block that covers the periphery of the interface pins, with one end thereof abutting on the one portion of the substrate, and with a part of the interface pins protruding from the other end; and
   a housing for storing the substrate, the housing being provided with a hole through which the dielectric block penetrates.

2. The optical transceiver according to claim 1, wherein the interface pins include at least one signal pin and a plurality of ground pins that are arranged around the signal pin(s).

3. The optical transceiver according to claim 1, wherein the interface pins include at least one signal pin and a plurality of ground through holes that are arranged around the signal pin(s).

4. The optical transceiver according to claim 1, wherein a dielectric constant of the dielectric block is lower than a dielectric constant of the substrate.

* * * * *